United States Patent
Ishibashi

(10) Patent No.: US 10,471,481 B2
(45) Date of Patent: Nov. 12, 2019

(54) ROLL-TYPE PROCESSING MEMBER, PENCIL-TYPE PROCESSING MEMBER, AND SUBSTRATE PROCESSING APPARATUS INCLUDING ANY ONE OF THESE

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 952 days.

(21) Appl. No.: 14/920,045

(22) Filed: Oct. 22, 2015

(65) Prior Publication Data

US 2016/0126113 A1    May 5, 2016

(30) Foreign Application Priority Data

Oct. 31, 2014  (JP) ................................. 2014-223754

(51) Int. Cl.
| | | |
|---|---|---|
| *B08B 1/00* | (2006.01) | |
| *B08B 1/04* | (2006.01) | |
| *B08B 3/10* | (2006.01) | |
| *H01L 21/67* | (2006.01) | |

(52) U.S. Cl.
CPC .......... *B08B 3/10* (2013.01); *H01L 21/67046* (2013.01)

(58) Field of Classification Search
CPC ... A46B 13/001; A46B 9/005; A47L 11/4041; B08B 1/00; B08B 1/04; B08B 3/10; B24B 53/017; H01L 21/67046
USPC ................. 15/102, 179, 230.16; 451/444, 38
See application file for complete search history.

(56) References Cited

U.S. PATENT DOCUMENTS

| | | | | | |
|---|---|---|---|---|---|
| 4,217,737 | A | * | 8/1980 | Hasegawa ............... | B24D 13/06 15/230.16 |
| 5,779,526 | A | * | 7/1998 | Gill ....................... | B24B 53/017 451/242 |
| 5,966,765 | A | * | 10/1999 | Hamada ............ | H01L 21/67046 15/102 |
| 6,202,658 | B1 | * | 3/2001 | Fishkin ............. | H01L 21/67046 134/147 |

(Continued)

FOREIGN PATENT DOCUMENTS

| | | |
|---|---|---|
| EP | 0937509 A1 | 8/1999 |
| JP | H08-071511 A | 3/1996 |

(Continued)

OTHER PUBLICATIONS

Taiwan Patent Application No. 104131754; Office Action; dated Apr. 16, 2018; 9 pages.

(Continued)

*Primary Examiner* — Joseph J Hail
*Assistant Examiner* — Arman Milanian
(74) *Attorney, Agent, or Firm* — Baker & Hostetler LLP

(57) ABSTRACT

A roll-type cleaning member for scrubbing and cleaning a target cleaning surface of a substrate includes a plurality of nodules formed on a surface thereof. Each nodule includes a slit which extends so as not to be parallel to the rotation direction of the roll-type cleaning member, upstream edges are formed by the slit so as to serve as edges first contacting the target cleaning surface when a cleaning surface of the nodule contacts the target cleaning surface of the substrate by the rotation of the roll-type cleaning member, and the upstream edges are provided at a plurality of positions of the cleaning surface of the nodule in the circumferential direction.

21 Claims, 33 Drawing Sheets

(56) References Cited

U.S. PATENT DOCUMENTS

| | | | | |
|---|---|---|---|---|
| 6,467,120 | B1* | 10/2002 | Ziemins | B08B 1/04 15/102 |
| 6,502,273 | B1* | 1/2003 | Mihara | B08B 1/04 15/102 |
| 6,904,637 | B2* | 6/2005 | Sugarman | B08B 1/04 134/199 |
| 2002/0028640 | A1* | 3/2002 | Barnhart | B08B 1/00 451/41 |
| 2006/0266380 | A1* | 11/2006 | Yamanaka | B41F 35/005 134/6 |
| 2006/0276108 | A1* | 12/2006 | Benson | A46B 13/008 451/41 |
| 2013/0133692 | A1* | 5/2013 | Withers | A46B 9/02 134/6 |
| 2013/0255721 | A1* | 10/2013 | Tyrrell | H01L 21/02096 134/6 |
| 2014/0230170 | A1* | 8/2014 | Patel | H01L 21/67046 15/88.4 |

FOREIGN PATENT DOCUMENTS

| | | | |
|---|---|---|---|
| JP | 08-141521 A | 6/1996 | |
| JP | 2000-270929 A | 10/2000 | |
| JP | 2000-311878 A | 11/2000 | |
| JP | 2004-273530 A | 9/2004 | |
| KR | 20110081489 A * | 7/2011 | ....... H01L 21/67046 |
| TW | 200704479 A | 2/2007 | |
| WO | WO 98/20987 | 5/1998 | |
| WO | WO 2013/049207 A2 | 4/2013 | |

OTHER PUBLICATIONS

Japan Patent Application No. 2014-223754; Reasons for Refusal; dated Nov. 21, 2017; 7 pages.
Japan Patent Application No. 2014-223754; Reasons for Refusal; dated Dec. 25, 2017; 6 pages.

* cited by examiner

ROLL-TYPE PROCESSING MEMBER, PENCIL-TYPE PROCESSING MEMBER, AND SUBSTRATE PROCESSING APPARATUS INCLUDING ANY ONE OF THESE

CROSS-REFERENCE TO RELATED APPLICATION

This application claims the benefit of Japanese Patent Application No. 2014-223754, filed on Oct. 31, 2014, the content of which is incorporated herein by reference.

FIELD

The technology relates to a roll-type processing member (particularly, a roll-type processing member having nodules formed on a surface thereof) that scrubs a surface of a substrate such as a semiconductor wafer while rotating about an axis parallel to the surface of the substrate so as to process the surface of the substrate, a pencil-type processing member that processes the surface of the substrate while contacting the substrate, and a substrate processing apparatus that uses any one of the roll-type processing member and the pencil-type processing member.

BACKGROUND

In recent years, a substrate (a substrate having films of various materials with different properties) having a microscopic structure is processed in accordance with a decrease in size of a semiconductor device. For example, in a damascene wiring process of burying a wiring groove formed in a substrate by metal, extra metal is removed by polishing using a substrate polishing apparatus (a CMP apparatus) after a damascene wiring is formed, and films (a metal film, a barrier film, an insulation film, and the like) of various materials having different properties are formed on the surface of the substrate. Slurry residues or metal polishing chips (Cu polishing chips) which are used in CMP polishing exist on the surface of the substrate. For that reason, when the surface of the substrate is complex and is not sufficiently cleaned due to the difficulty in cleaning the surface of the substrate, a leakage or a poor adhesion occurs due to the influence of residues. Accordingly, there is a concern that the reliability may be degraded. Here, a cleaning treatment is performed after the polishing treatment in the CMP apparatus that polishes the semiconductor substrate.

As the substrate cleaning method, a roll cleaning treatment (for example, see WO 98/020987 A) is known in which a member (a roll-type cleaning member) such as a cylindrical sponge is held so that the axis is parallel to the surface of the substrate and is rotated about the axis while scrubbing the surface of the substrate at the side surface thereof so as to scrub-clean the surface of the substrate or a pencil cleaning treatment (for example, see JP 8-141521 A) is known in which a member (a pencil-type cleaning member) such as a cylindrical sponge is held so that the axis is perpendicular to the surface of the substrate and is brought into contact with the surface of the rotating substrate at the bottom surface thereof so as to scrub-clean the surface of the substrate.

A plurality of small columnar protrusions (nodules) is formed on the surface of the roll-type cleaning member and the roll-type cleaning member rotates about the axis parallel to the surface of the substrate, the nodules sequentially scrub the surface of the substrate so as to clean the surface of the substrate. Although a cleaning liquid is supplied onto the substrate during the scrub-cleaning treatment, JP H8-141521 A has a structure in which a slit is formed on the bottom surface of the pencil-type cleaning member in order to uniformly supply the cleaning liquid to a cleaning portion.

SUMMARY

FIG. 23 is a diagram illustrating a state where a nodule of a roll-type cleaning member scrubs a surface of a substrate. Further, FIG. 24A is a perspective view illustrating each nodule, FIG. 24B is a diagram illustrating a cleaning surface (a surface contacting the substrate) of the nodule not contacting the substrate, and FIG. 24C is a diagram illustrating the cleaning surface of the nodule contacting the substrate. In FIGS. 24A to 24C, the arrow a indicates the longitudinal direction (the rotation axis direction) of the roll-type cleaning member, and the arrow c indicates the rotation direction (the circumferential direction) of the surface of the roll-type cleaning member.

As illustrated in FIGS. 24A and 24B, each nodule N has a columnar shape, and a cleaning surface CF has a circular shape. However, when the nodule N contacts the front surface (the target cleaning surface) of the substrate S by the rotation of a roll-type cleaning member R as illustrated in FIG. 23, the nodule N is pressed, and dragged and deformed by the surface of the substrate S. As a result, the cleaning surface CF is also crushed in the rotation direction as illustrated in FIG. 24C. However, the pressure applied to the cleaning surface CF of the nodule N is intensively applied to the vicinity of the upstream edge (the hatching portion of FIG. 24C) as illustrated in FIG. 24C, and hence the contribution degree for the cleaning of the other portion decreases.

Further, in JP H8-141521 A in which the slit is formed on the bottom surface of the pencil-type cleaning member, the cleaning liquid entering the slit stays in the slit when the cleaning liquid is supplied from the outside of the pencil-type cleaning member to the surface of the substrate. As a result, a problem arises in that a fresh cleaning liquid cannot be supplied to the cleaning portion.

Although the cleaning apparatus has been described above, a buff processing apparatus also scrubs the surface of the substrate by using a roll-type buff processing member having the nodule or a pencil-type buff processing member having the slit. In this case, the above-described problem may arise.

An object of the technology is to improve the processing ability of the substrate processing treatment (the cleaning treatment or the buff processing treatment) of scrubbing the surface of the substrate by using a roll-type processing member having the nodule or a pencil-type processing member having the slit.

A roll-type processing member according to an aspect of the present disclosure is a roll-type processing member for processing a surface of a substrate by scrubbing the surface of the substrate, including: a nodule which is formed on a surface of the roll-type processing member, wherein the nodule includes a plurality of upstream edges which are provided in the rotation direction of the roll-type processing member, the plurality of upstream edges being edges located at the upstream sides of a front end surface of the nodule when the front end surface contacts the surface of the substrate by the rotation of the roll-type processing member.

With this configuration, since the upstream edges of each nodule scrub the target cleaning surface plural times, the cleaning effect of each nodule is improved.

At least one of the plurality of upstream edges may be formed in a manner such that a slit or a concave portion is formed on the front end surface of the nodule.

The adjacent nodules in the rotation direction of the roll-type processing member may include an overlap portion in which the adjacent nodules overlap each other in the rotation axis direction of the roll-type processing member, and the at least one of the plurality of upstream edges formed by the slit or the concave portion may have a length in which a non-overlap portion except for the overlap portion in the front end surface is covered in the rotation axis direction of the roll-type processing member.

With this configuration, since two nodule rows scrub the target cleaning surface of the substrate, the upstream edges scrub the target cleaning surface of the substrate twice even at the non-overlap portion, and hence the cleaning effect in the non-overlap portion is improved.

The slit or the concave portion may have a shape which is narrowed in the depth direction.

With this configuration, since the nodule is pressed and dragged by the target cleaning surface of the substrate, the slit or the concave portion is buried, and hence the possibility of removing the upstream edges can be decreased.

A roll-type processing member according to another aspect of the technology is a roll-type processing member for processing a surface of a substrate by scrubbing the surface of the substrate, including: a nodule which is formed on a surface of the roll-type processing member, wherein the nodule includes a slit or a concave portion which extends so as not to be parallel to the rotation direction of the roll-type processing member.

With this configuration, since the plurality of upstream edges exists in each nodule so that the upstream edges scrub the target cleaning surface, the cleaning effect of each nodule is improved.

The slit may be bent in a convex shape in the rotation direction of the roll-type processing member.

With this configuration, dirt inside the slit is scraped out to the left and right sides by the rotation of the roll-type processing member (the movement of the nodule).

A substrate cleaning apparatus according to another aspect of the technology includes: any one of the above-described roll-type processing members; a rotational driving mechanism which rotates the roll-type processing member about the rotation axis; and a substrate holder which holds the substrate so that the surface of the substrate is parallel to the rotation axis direction of the roll-type processing member at a position contacting the nodule of the roll-type processing member.

Even with this configuration, since the upstream edges of each nodule scrub the target cleaning surface plural times, the cleaning effect of each nodule is improved.

A pencil-type processing member according to an aspect of the technology is a pencil-type processing member for processing a surface of a substrate by scrubbing the surface of the substrate at a bottom surface thereof, wherein a continuous slit is formed on the bottom surface while not being divided from one edge to the other edge.

With this configuration, since the slit is formed in the bottom surface of the pencil-type processing member that scrubs the surface of the substrate, any one of both sides of the slit becomes the upstream edge, and hence the processing ability of scrubbing the surface of the substrate is improved compared with the pencil-type processing member without any slit. Further, since the slit is continuously formed while not being divided from one edge to the other edge, the liquid supplied to the surface of the substrate is easily led to and discharged from the slit, and hence a fresh liquid can be supplied to the slit.

The slit may be formed in a linear shape.

With this configuration, the liquid supplied to the surface of the substrate can be easily led to and discharged from the slit.

The pencil-type processing member may include a plurality of slits having different depths.

Since the depths of the plurality of slits are adjusted, the partial deformation among the slits of the pencil-type processing member can be adjusted. For example, the slit close to the center can be set to a comparatively deep depth and the slit separated from the center can be set to a comparatively shallow depth. Alternatively, the slit can be formed in a reverse manner.

The pencil-type processing member is a pencil-type cleaning member for performing a cleaning treatment on the surface of the substrate, and the pencil-type cleaning member may be formed of a soft sponge.

With this configuration, the scrub-cleaning treatment can be performed while the surface of the substrate is scrubbed by the pencil-type cleaning member.

The pencil-type processing member may be a pencil-type buff processing member for performing a buff processing treatment on the surface of the substrate, and the pencil-type buff processing member may includes a base portion and a buff processing pad which is provided at the lower surface of the base portion so as to become a bottom surface.

With this configuration, the buff processing treatment can be performed while the surface of the substrate is scrubbed by the pencil-type buff processing member.

A substrate processing apparatus according to another aspect of the technology includes: any one of the above-described pencil-type processing members; a rotational driving mechanism which rotates the pencil-type processing member about the rotation axis perpendicular to the bottom surface; and a substrate holder which holds the substrate so that the surface of the substrate is parallel to the bottom surface of the pencil-type processing member at a position contacting the bottom surface of the pencil-type processing member.

Even with this configuration, since the slit is formed in the bottom surface of the pencil-type processing member that scrubs the surface of the substrate, any one of both sides of the slit becomes the upstream edge, and hence the processing ability of scrubbing the surface of the substrate is improved compared with the pencil-type processing member without any slit. Further, since the slit is continuously formed while not being divided from one edge to the other edge, the liquid supplied to the surface of the substrate is easily led to and discharged from the slit, and hence a fresh liquid can be supplied to the slit.

A substrate processing apparatus according to another aspect of the technology includes: any one of the above-described pencil-type processing members; and a substrate rotation mechanism which holds and rotates the substrate so that the surface of the substrate is parallel to the bottom surface of the pencil-type processing member at a position contacting the bottom surface of the pencil-type processing member.

Even with this configuration, since the slit is formed in the bottom surface of the pencil-type processing member that scrubs the surface of the substrate, any one of both sides of the slit becomes the upstream edge, and hence the processing ability of scrubbing the surface of the substrate is improved compared with the pencil-type processing member without any slit. Further, since the slit is continuously formed while not being divided from one edge to the other edge, the liquid supplied to the surface of the substrate is easily led to and discharged from the slit, and hence a fresh liquid can be supplied to the slit.

According to any one of several aspects of the technology, since the upstream edges of each nodule scrub the surface of the substrate plural times, the processing ability of scrubbing the surface of the substrate by each nodule is improved. Further, according to another aspect of the technology, since the bottom surface of the pencil-type processing member that scrubs the surface of the substrate is provided with the slit which is continuous while not being divided from one edge to the other edge, the processing ability of scrubbing the surface of the substrate is improved. At this time, since the liquid supplied to the surface of the substrate is easily led to and discharged from the slit, a fresh liquid can be supplied to the slit.

As will be described below, the technology may be implemented in various forms. Thus, the disclosure of the technology is only a part of the technology, and is not intended to limit the scope of claims of the technology.

DETAILED DESCRIPTION

A roll-type processing member, a pencil-type processing member, and a substrate processing apparatus including any one of these of an embodiment will hereinafter be given with reference to the drawings. In addition, the embodiment to be described below is an example of a case of the implementation of the technology, and the technology is not limited to the detailed configuration described below. In the implementation of the technology, a detailed configuration may be appropriately employed in response to the embodiment.

1. First Embodiment

Substrate Cleaning Apparatus Including Roll-Type Cleaning Member

Figure 1:
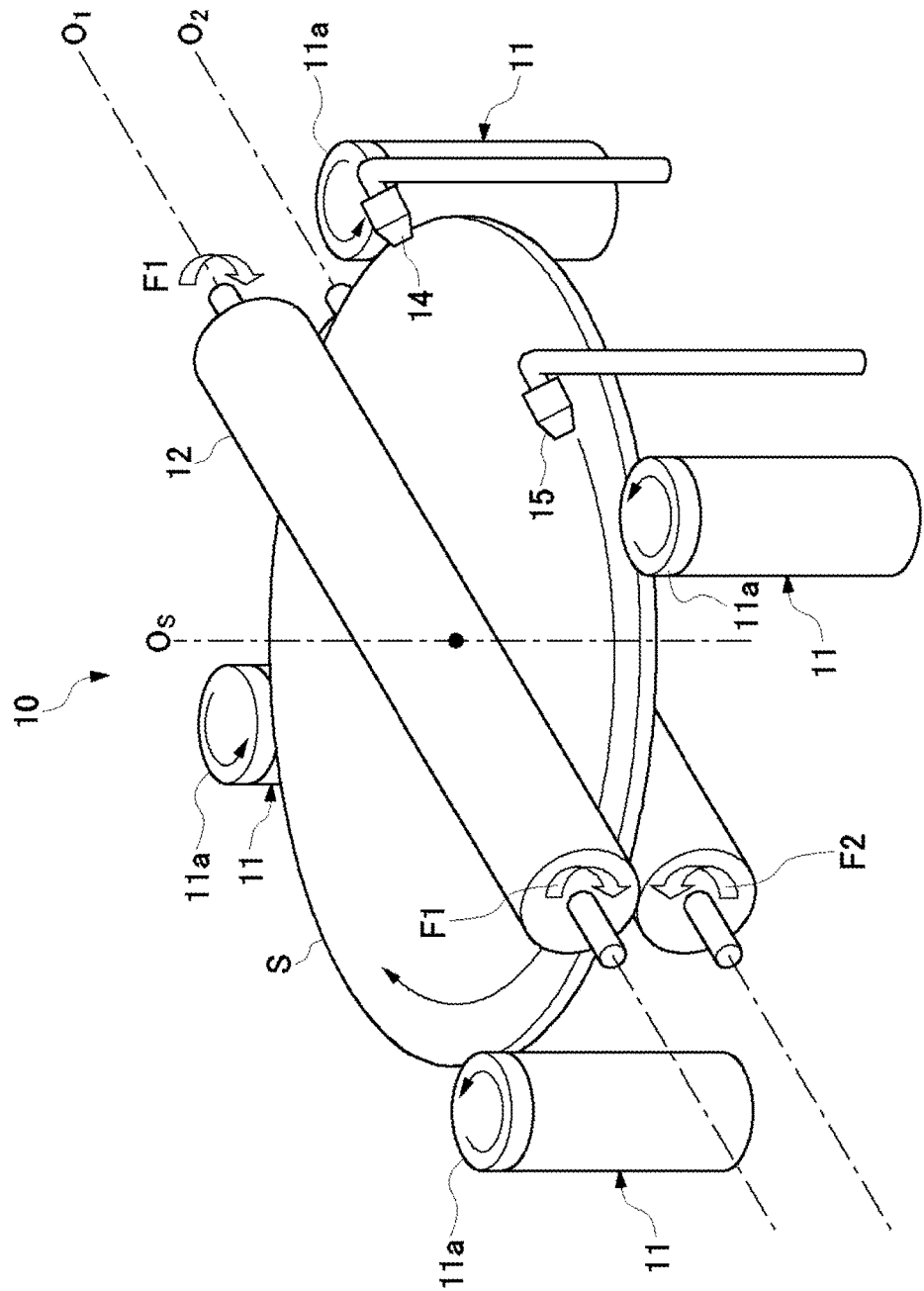
FIG. 1 is a perspective view illustrating an outline of a cleaning apparatus of a first embodiment of the technology.

FIG. 1 is a perspective view illustrating an outline of a substrate processing apparatus (a substrate cleaning apparatus) according to a first embodiment. As illustrated in FIG. 1, a substrate cleaning apparatus 10 includes a plurality of (in FIG. 1, four) spindles 11 (substrate holders) which serves as substrate rotation mechanisms movable in the horizontal direction, supports a circumferential edge of a substrate S so that a front surface of the substrate is directed upward, and rotates the substrate S in the horizontal direction, an upper roll-type cleaning member (roll sponge) 12 which is rotatably supported by a roll holder (not illustrated), and a lower roll-type cleaning member (roll sponge) 13 which is rotatably supported by a roll holder (not illustrated). Each of the upper roll-type cleaning member 12 and the lower roll-type cleaning member 13 is formed in a columnar shape, extends in an elongated shape, and is formed of, for example, PVA. In addition, the upper roll-type cleaning member 12 is elevatable up and down with respect to the front surface of the substrate S by the roll holder, and the lower roll-type cleaning member 13 is elevatable up and down with respect to the rear surface of the substrate S by the roll holder.

The upper roll-type cleaning member 12 rotates as indicated by the arrow F1 by a driving mechanism (a rotational driving mechanism) not illustrated in the drawings, and the lower roll-type cleaning member 13 rotates as indicated by the arrow F2 by a driving mechanism not illustrated in the drawings. Two cleaning liquid supply nozzles 14 and 15 are located above the substrate S supported and rotated by the spindles 11 so as to supply a cleaning liquid to the front surface of the substrate S. The cleaning liquid supply nozzle 14 is a nozzle which supplies a rinse liquid (for example, superpure water) to the front surface of the substrate S, and the cleaning liquid supply nozzle 15 is a nozzle which supplies a chemical liquid to the front surface of the substrate S.

The substrate cleaning apparatus 10 rotates the substrate S in the horizontal direction by rotating (spinning) a frame 11a while positioning the circumferential edge of the substrate S to a fitting groove formed on the outer circumferential surface of the frame 11a provided in the upper portion of the spindle 11 and pressing the circumferential edge inward. In this example, two frames 11a of four frames 11a apply a rotational force to the substrate S and the other two frames 11a serve as bearings to receive the rotation of the substrate S. In addition, all frames 11a may be connected to the driving mechanism so that a rotational force is applied to the substrate S.

In this way, the rinse liquid is supplied from the cleaning liquid supply nozzle 14 to the front surface of the substrate S and the chemical liquid is supplied from the cleaning liquid supply nozzle 15 to the front surface of the substrate S while the substrate S is rotated in the horizontal direction. In this state, the upper roll-type cleaning member 12 is moved down in a rotation state so as to contact the front surface of the rotating substrate S. Accordingly, the front surface of the substrate S is scrub-cleaned by the upper roll-type cleaning member 12 under the presence of the cleaning liquid (the rinse liquid and the chemical liquid).

The length of each of the upper roll-type cleaning member 12 and the lower roll-type cleaning member 13 is set to be slightly longer than the diameter of the substrate S. The upper roll-type cleaning member 12 and the lower roll-type cleaning member 13 are disposed so as to extend in the entire length of the diameter of the substrate S while the axes (the rotation axes) $O_1$ and $O_2$ are substantially orthogonal to the axis (that is, the rotation center) $O_S$ of the substrate S. Accordingly, both front and rear surfaces of the substrate S are cleaned at the same time.

Figure 2:
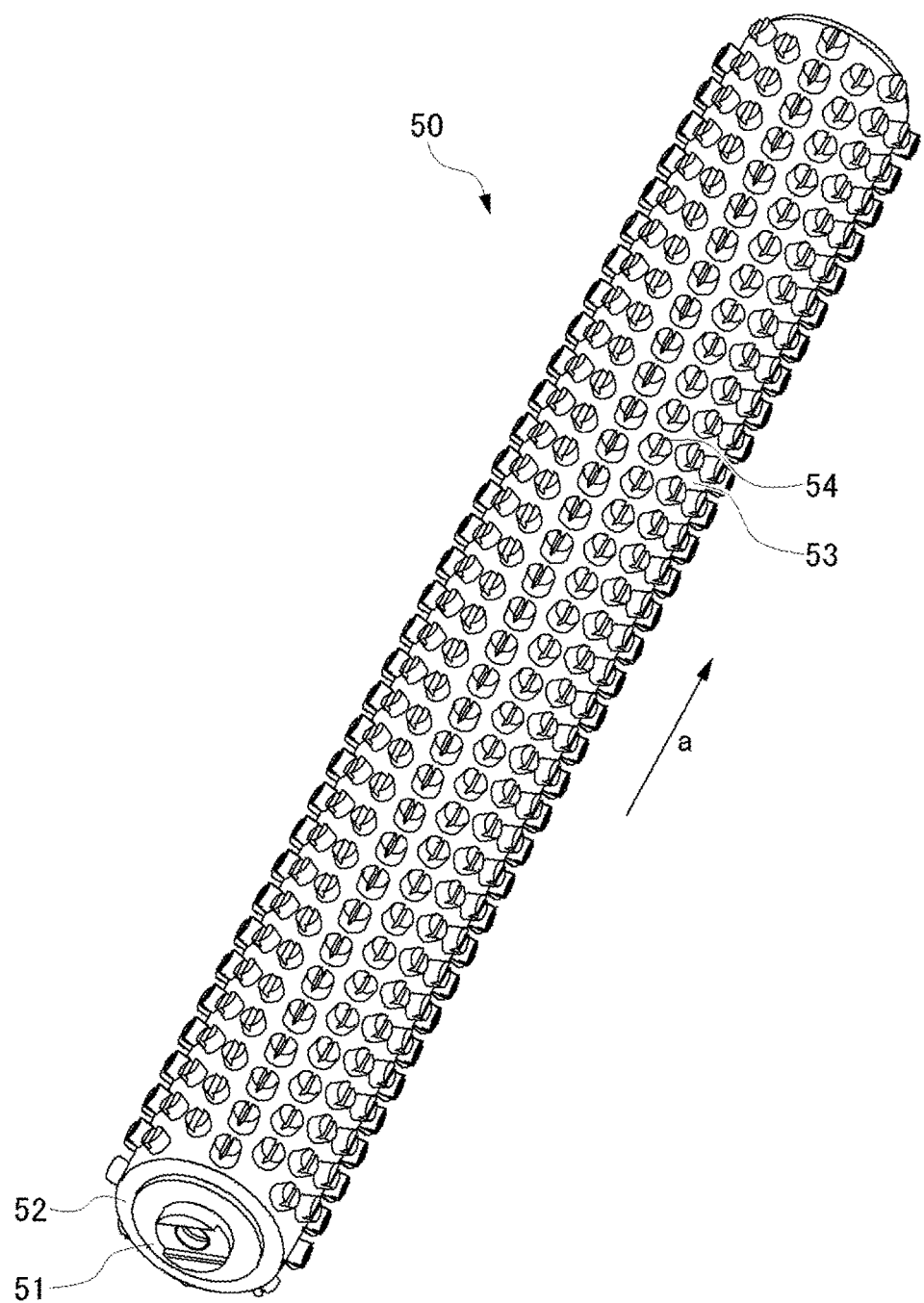
FIG. 2 is a perspective view illustrating a roll-type cleaning member of the first embodiment of the technology.
Figure 3:
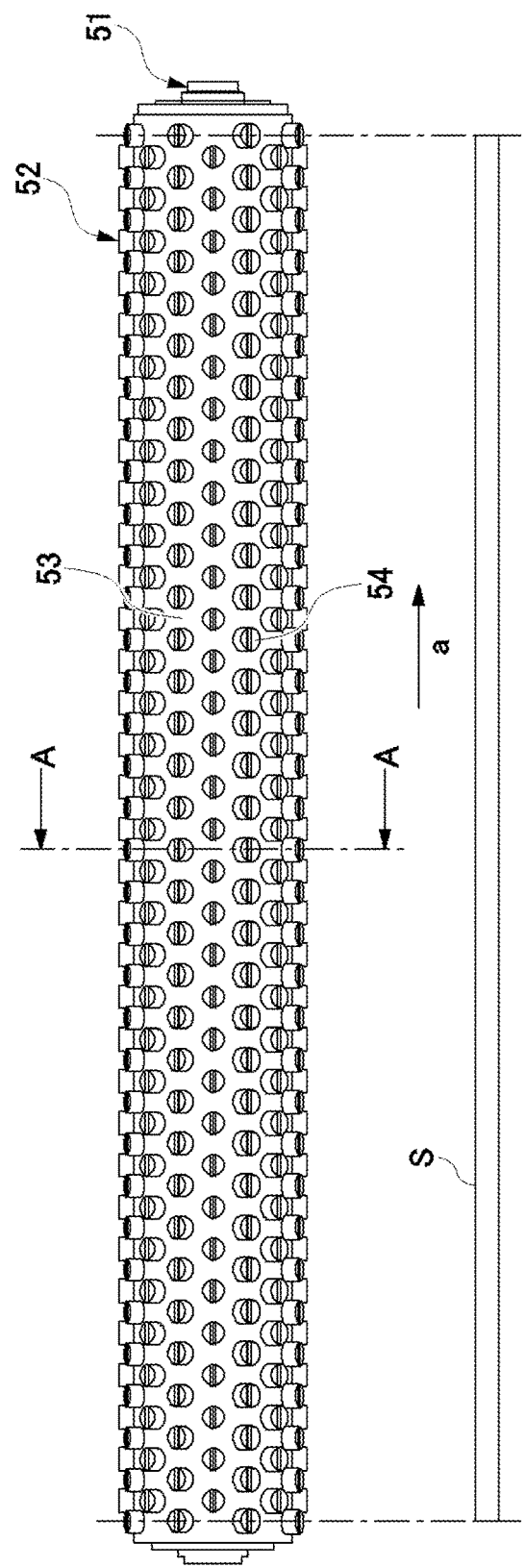
FIG. 3 is a front view illustrating the roll-type cleaning member of the first embodiment of the technology.
Figure 4:
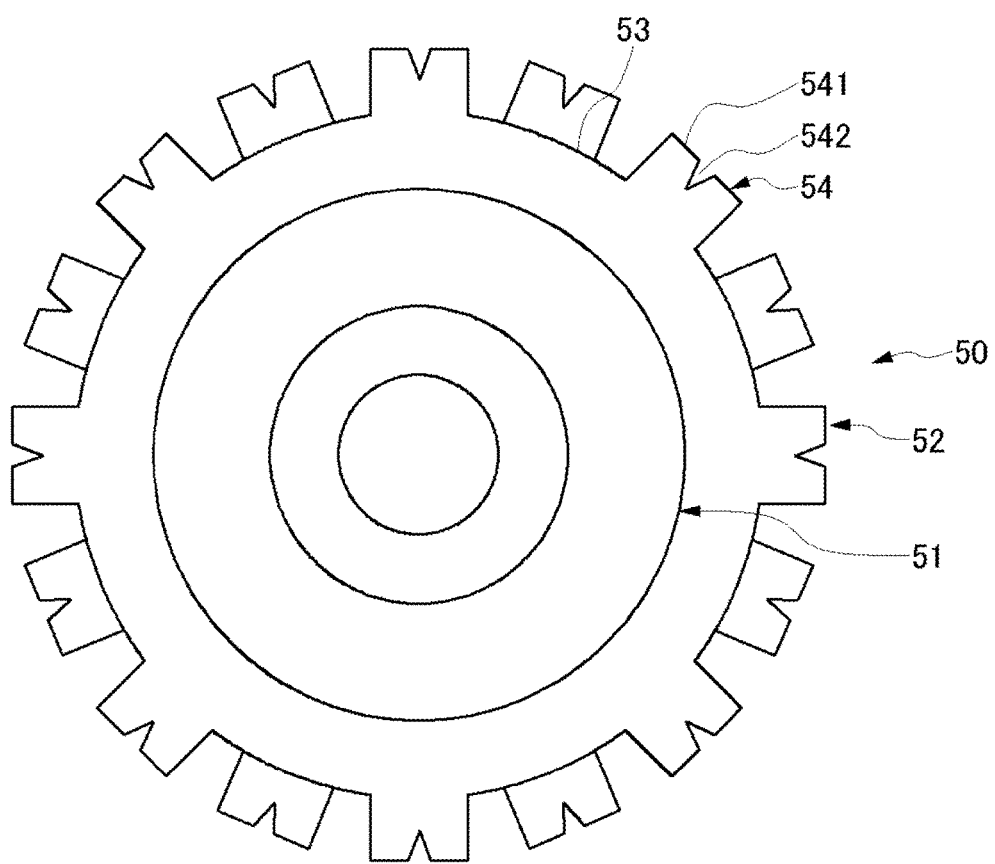
FIG. 4 is a cross-sectional view taken along the line A-A of FIG. 3.

FIG. 2 is a perspective view illustrating the roll-type cleaning member of the embodiment, FIG. 3 is a front view illustrating the roll-type cleaning member of the embodiment, and FIG. 4 is a cross-sectional view taken along the line A-A of FIG. 3. As illustrated in FIGS. 2 to 4, a roll-type cleaning member 50 having nodules formed on the surface thereof can be used as the upper roll-type cleaning member 12 or the lower roll-type cleaning member 13 of FIG. 1. Further, the roll-type cleaning member can be used as both upper and lower roll-type cleaning members.

As illustrated in FIGS. 2 to 4, the roll-type cleaning member 50 includes a columnar core 51 and a cylindrical sponge member 52 which is fixed to the outer circumferential surface of the core 51. The sponge member 52 has a shape in which the nodules 54 protrude from a base surface 53 as a surface of a column. The plurality of nodules 54 is arranged in a plurality of lines parallel to the rotation axis direction (the longitudinal direction) a of the roll-type cleaning member 50. These lines are separated from each other at the same interval in the circumferential direction. The nodules 54 which are adjacent to each other in the circumferential direction are deviated from each other by a half pitch in the rotation axis direction. Thus, when a cross-sectional view in a plane perpendicular to the longitudinal direction is viewed as illustrated in FIG. 4, the plurality of nodules 54 is arranged at the same interval in the circumferential direction. In addition, the arrangement of the plurality of nodules is merely an example, and the other arrangement may be employed.

Figure 5A:
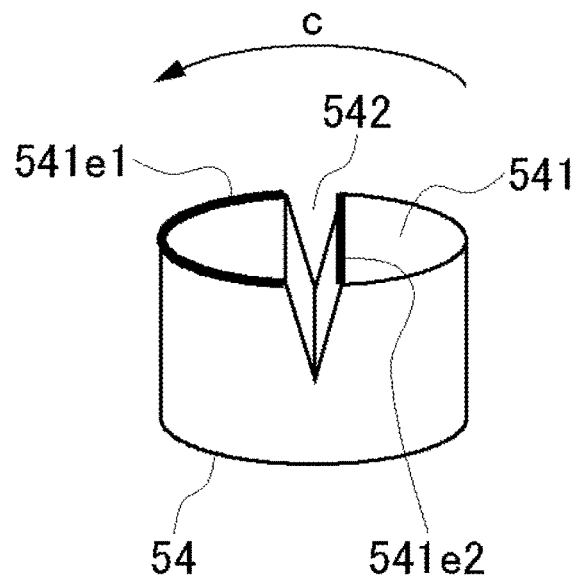
FIG. 5A is a perspective view of a nodule of the first embodiment of the technology.
Figure 5B:
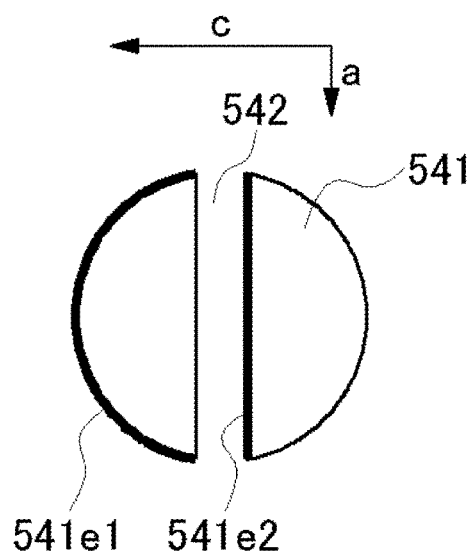
FIG. 5B is a diagram illustrating a state where a cleaning surface of the nodule of the first embodiment of the technology does not contact a substrate.
Figure 5C:
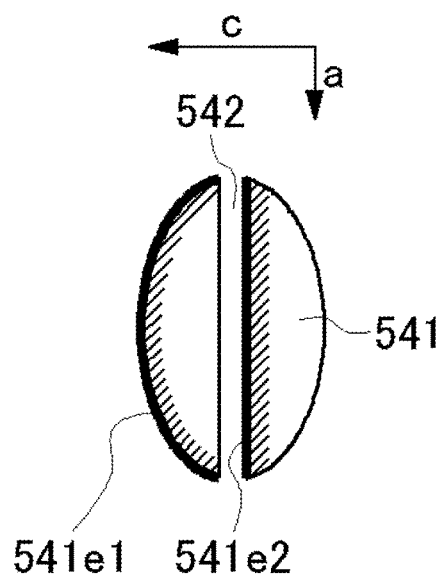
FIG. 5C is a diagram illustrating a state where the cleaning surface of the nodule of the first embodiment of the technology contacts the substrate.

FIG. 5A is a perspective view of the nodule of the embodiment, FIG. 5B is a diagram illustrating a state where the cleaning surface of the nodule of the embodiment does not contact the substrate, and FIG. 5C is a diagram illustrating a state where the cleaning surface of the nodule of the embodiment contacts the substrate. As illustrated in FIGS. 2 to 4 and specifically illustrated in FIGS. 5A to 5C, each nodule 54 includes a slit 542 formed on a cleaning surface 541. Further, in the roll-type cleaning member 50 illustrated in FIGS. 2 and 3, all nodules 54 have the slits (the grooves) 542, but only a part of the nodules 54 provided in the roll-type cleaning member 50 may have the slits 542.

The slit 542 extends in parallel to a direction perpendicular to the rotation direction c of the roll-type cleaning member 50, that is, the rotation axis direction a of the roll-type cleaning member 50. As illustrated in FIGS. 4 and 5A, the slit 542 has a tapered shape which is narrowed as it goes deeper, and the cross-section thereof is an inverted triangular shape (V-shape).

The edge which first contacts the target cleaning surface of the substrate S when the roll-type cleaning member 50 rotates so that the cleaning surface 541 of the nodule contacts the target cleaning surface of the substrate S will be referred to as the "upstream edge". The side (upstream side) as the upstream edge can be referred to as the "thrust side" and the downstream side thereof can be referred to as the "escape side".

Since the slit 542 is formed, a part of the cleaning surface 541 of the nodule having a columnar shape in the related art is removed. Accordingly, a plurality of upstream edges exists in the rotation direction c of the roll-type cleaning member 50. Specifically, as illustrated in FIGS. 5A to 5C, each nodule 54 includes a first upstream edge 541e1 and a second upstream edge 541e2 located at the downstream side in the rotation direction c.

As described above, the cleaning effect in the vicinity of the upstream edge of the cleaning surface 541 is higher than that of the other portion. Since the nodule 54 of the embodiment includes a plurality of upstream edges in the rotation direction c as illustrated in FIG. 5C, an area (a hatching portion of FIG. 5C) having high cleaning effect can be provided at a plurality of positions. Accordingly, since the upstream edge having high cleaning effect in each nodule 54 scrubs the target cleaning surface of the substrate S twice, the cleaning effect of each nodule 54 is improved compared with the existing nodule.

In this way, the slit 542 is formed in the nodule 54 in order to form the second upstream edge 541e2. Thus, the width or the depth of the slit 542 is designed so that the slit 542 in the cleaning surface 541 is not buried by the nodule 54 crushed in the rotation direction c when the target cleaning surface of the substrate S is scrubbed by the rotating nodule 54.

Specifically, when the width of the slit 542 is too narrow and the depth thereof is too deep, the nodule 54 is crushed in the rotation direction c so as to bury the slit 542 when the target cleaning surface of the substrate S is scrubbed. Accordingly, the shape of the slit 542 is designed so that the slit is wide and shallow in order to prevent such a situation. For example, when the height of the nodule 54 is 5 mm and the diameter thereof is 7 mm, the slit 542 is formed so that the width in the cleaning surface 541 is about 1 mm and the depth in the cleaning surface 541 is about 2 mm. Further, since the slit 542 has a V-shape which is narrowed gradually in the depth direction as described above, a deformation of burying the slit 542 hardly occurs.

Figure 6:
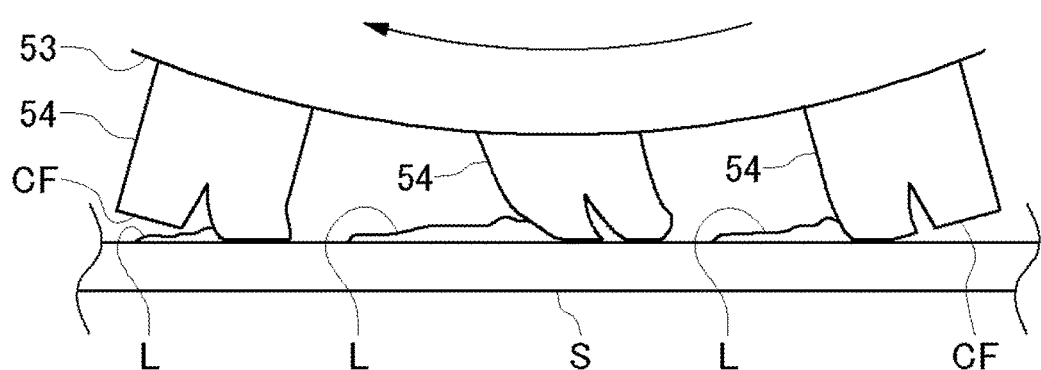
FIG. 6 is a diagram illustrating a state where the nodule of the first embodiment of the technology scrubs the surface of the substrate.
Figure 7:
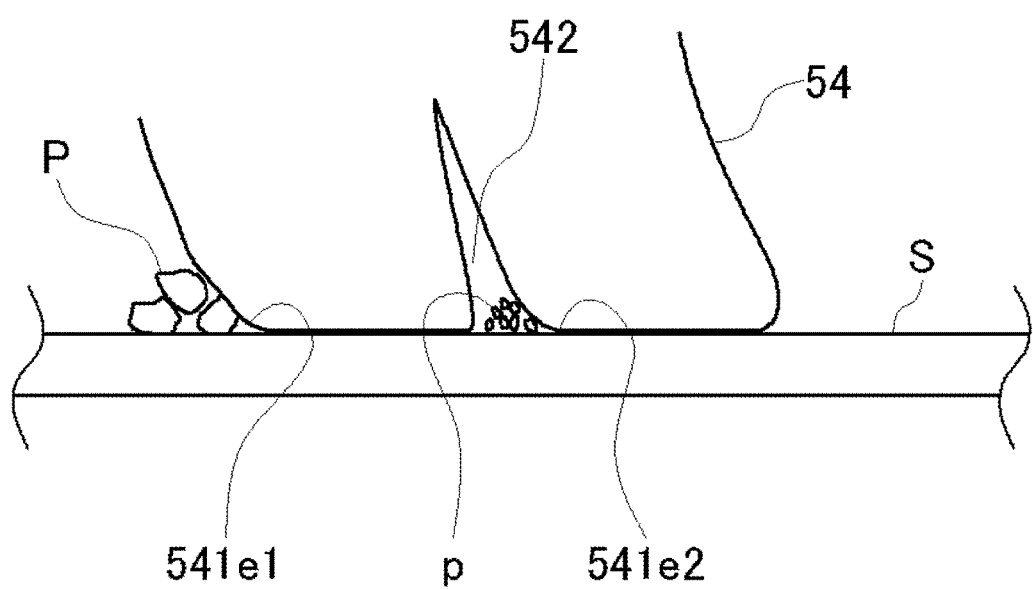
FIG. 7 is a partially enlarged view of FIG. 6.
Figure 23:
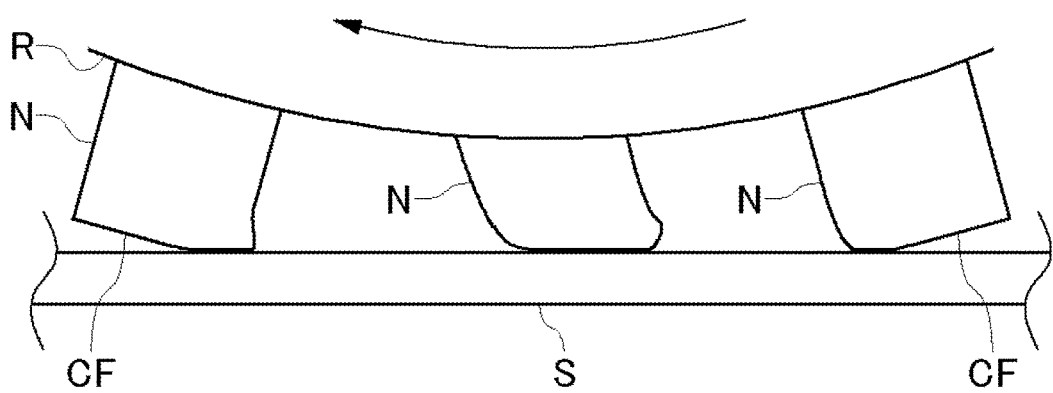
FIG. 23 is a diagram illustrating a state where a nodule of a roll-type cleaning member scrubs a surface of a substrate.
Figure 24A:
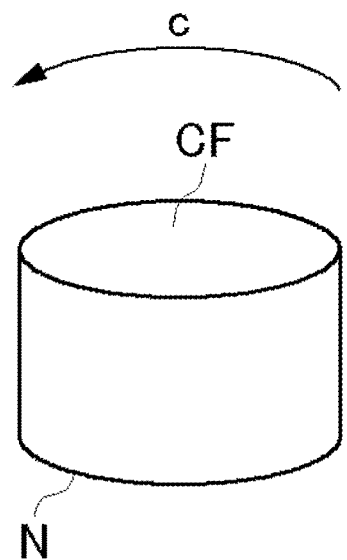
FIG. 24A is a perspective view illustrating one nodule.
Figure 24B:
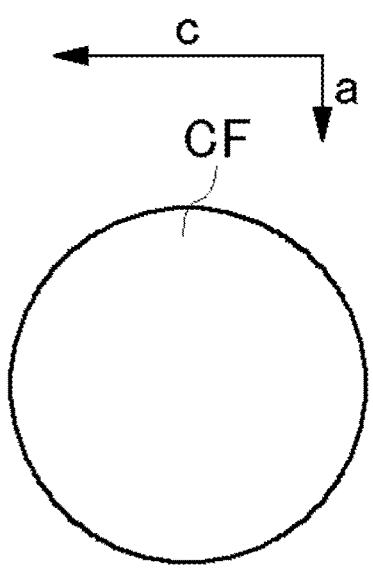
FIG. 24B is a diagram illustrating a cleaning surface of the nodule which does not contact the substrate.
Figure 24C:
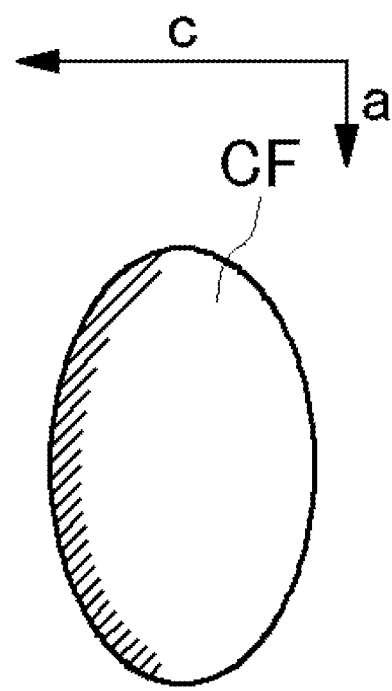
FIG. 24C is a diagram illustrating the cleaning surface of the nodule which contacts the substrate.

FIG. 6 is a diagram illustrating a state where the nodule scrubs the front surface of the substrate S. FIG. 6 corresponds to FIG. 23. Further, FIG. 7 is a partially enlarged view of FIG. 6. As illustrated in FIGS. 6 and 7, each nodule 54 scrubs the substrate S in order from the first upstream edge 541e1 to the second upstream edge 541e2 located at the downstream side thereof.

At this time, comparatively large particles P on the front surface of the substrate S are scraped by the first upstream edge 541e1, and comparatively small particles p are scraped by the second upstream edge 541e2. That is, the first upstream edge 541e1 is used for a rough cleaning treatment, and the second upstream edge 541e2 subsequent thereto is used for a fine cleaning treatment. Further, as illustrated in FIG. 6, the liquid L sufficiently exists in the first upstream edge 541e1, and the liquid L also exists in the second upstream edge 541e2.

Since the substrate S is scrubbed by each nodule 54 in order from the first upstream edge 541e1 to the second upstream edge 541e2 at the downstream side thereof, an excellent cleaning effect is exhibited compared with the case where the existing cylindrical nodule without the slit 542. This is because of the following reasons. First, each nodule decreases in size when the number of the cylindrical nodules increases. Accordingly, the nodule is easily deformed, and hence a physical force to the substrate decreases. Further, since the first upstream edge 541e1 and the second upstream edge 541e2 continuously scrub the substrate, the re-adhesion of the particles is suppressed.

Figure 8A:
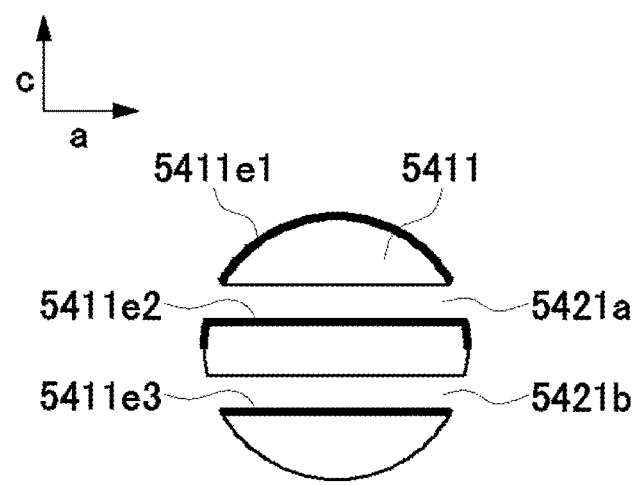
FIG. 8A is a diagram illustrating another example of a cleaning surface of a nodule provided with two upstream edges in the rotation direction of the first embodiment of the technology.
Figure 8B:
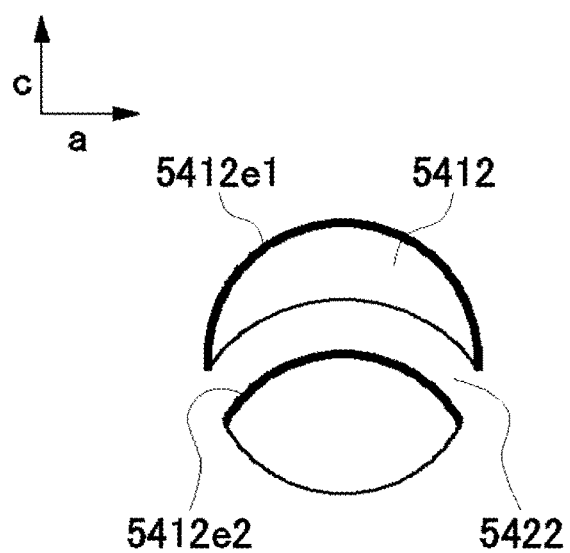
FIG. 8B is a diagram illustrating another example of a cleaning surface of a nodule provided with two upstream edges in the rotation direction of the first embodiment of the technology.
Figure 8C:
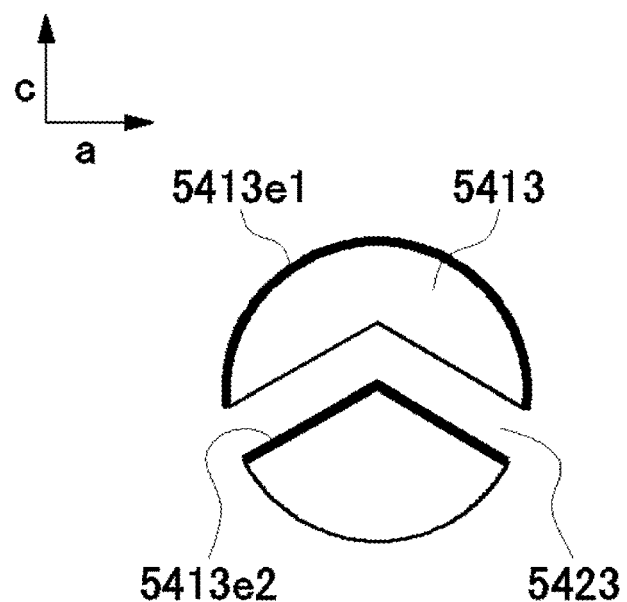
FIG. 8C is a diagram illustrating another example of a cleaning surface of a nodule provided with two upstream edges in the rotation direction of the first embodiment of the technology.
Figure 8D:
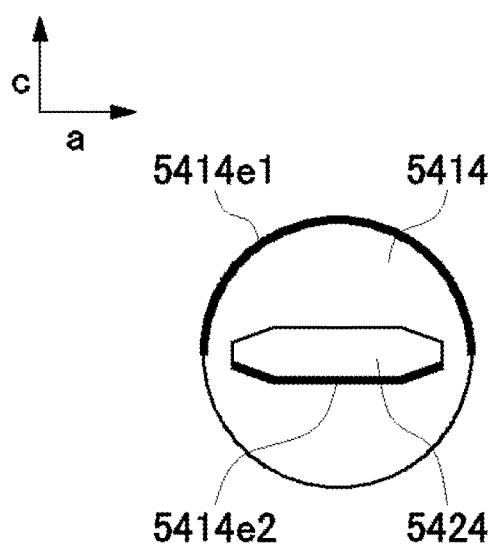
FIG. 8D is a diagram illustrating another example of a cleaning surface of a nodule provided with two upstream edges in the rotation direction of the first embodiment of the technology.
Figure 8E:
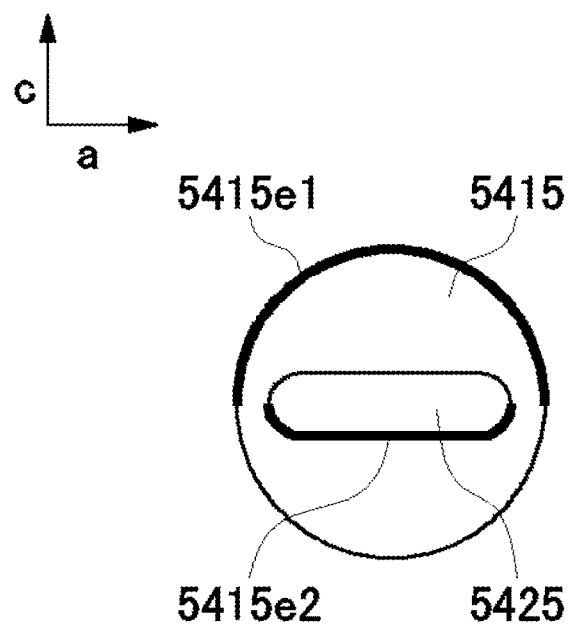
FIG. 8E is a diagram illustrating another example of a cleaning surface of a nodule provided with two upstream edges in the rotation direction of the first embodiment of the technology.
Figure 8F:
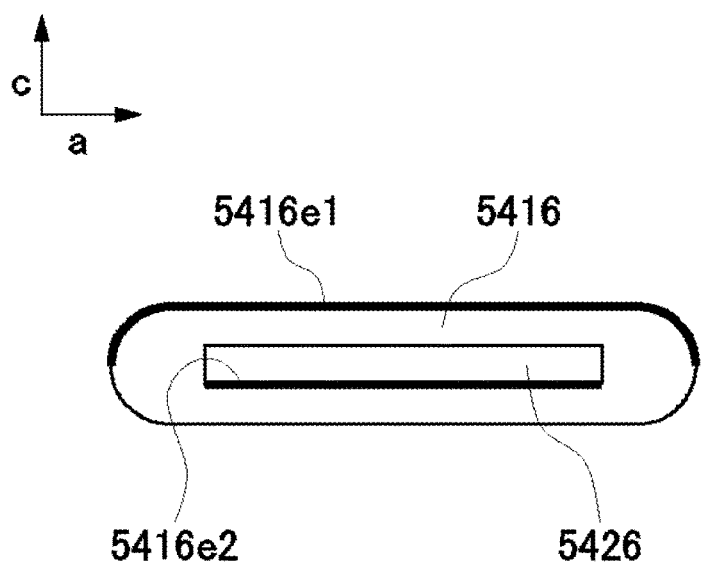
FIG. 8F is a diagram illustrating another example of a cleaning surface of a nodule provided with two upstream edges in the rotation direction of the first embodiment of the technology.

The configuration of the nodule 54 for forming two upstream edges in the rotation direction is not limited to the above-described configuration. FIGS. 8A to 8F illustrate another example of a cleaning surface of a nodule provided with two upstream edges in the rotation direction. FIGS. 8A to 8C illustrate an example in which the slit is formed on the cleaning surface similarly to the above-described embodiment, and FIGS. 8D to 8F illustrate an example in which a concave portion is formed on the cleaning surface.

Specifically, in the example of FIG. 8A, a cleaning surface 5411 is provided with two slits 5421a and 5421b which are parallel to the rotation axis direction a. Accordingly, three upstream edges 5411e1 to 5411e3 are formed in the rotation direction c. In this way, since three upstream edges 5411e1 to 5411e3 are provided in the example of FIG. 8A, the cleaning effect is further improved.

In the example of FIG. 8B, the cleaning surface 5412 is provided with a convex circular-arc curved slit 5422 in the rotation direction c. As a result, an upstream edge 5412e2 is formed so as to be curved in a convex circular-arc shape in the rotation direction c in addition to the upstream edge 5412e1. Even with this configuration, since two upstream edges 5412e1 and 5412e2 are provided, the cleaning effect is improved compared with the existing nodule.

In the example of FIG. 8C, a cleaning surface 5413 is provided with a U-shaped slit 5423 which is bent in a convex shape in the rotation direction c. In other words, in the example of FIG. 8C, two slits having different angles are connected at the center of the nodule. As a result, a U-shaped upstream edge 5413e2 which is bent in a convex shape in the rotation direction c is provided in addition to the upstream edge 5413e1. Even with this configuration, since two upstream edges 5413e1 and 5413e2 are formed, the cleaning effect is improved compared with the existing nodule.

In the examples of FIGS. 8B and 8C, since the slits 5422 and 5423 have a convex shape in the rotation direction c, dirt inside the slits is scraped out to the left and right sides of the slits by the rotation.

In the example of FIG. 8D, a cleaning surface 5414 is provided with a concave portion 5424 which has an elongated shape in the rotation axis direction a while both ends are formed in a trapezoidal shape. With this configuration, since the downstream edge of the concave portion 5424 is formed as an upstream edge 5414e2 in addition to an upstream edge 5414e1 as the upstream edge of the cleaning surface 5414, the cleaning effect is improved.

In the example of FIG. 8E, a cleaning surface 5415 is provided with a concave portion 5425 which has an elongated shape in the rotation axis direction a while both ends are formed in a circular-arc shape. With this configuration, since the downstream edge of the concave portion 5425 is formed as an upstream edge 5415e2 in addition to an upstream edge 5415e1 as the upstream edge of the cleaning surface 5415, the cleaning effect is improved.

In the example of FIG. 8F, a cleaning surface 5416 is not formed in a true circular shape, but is formed in an oval shape of which the longitudinal direction is parallel to the rotation axis direction a. The oval cleaning surface 5416 is provided with a concave portion 5426 which has an elongated shape in the rotation axis direction a while both ends are formed in a rectangular shape. Even with this configuration, since the downstream edge of the concave portion 5426 is formed as an upstream edge 5416e2 in addition to an upstream edge 5416e1 as the upstream edge of the cleaning surface 5416, the cleaning effect is improved. In this way, the shape of the cleaning surface of the nodule is not limited to the true circular shape, but may be an arbitrary shape including an oval shape, an ellipse shape, and the other polygonal shapes.

As illustrated in FIGS. 8A to 8F, slits or concave portions having various shapes can be formed in order to form a further upstream edge in the rotation direction c in addition to the upstream edge as the upstream edge of the cleaning surface 5415. In the examples of FIGS. 5A to 5C and FIGS. 8A to 8E, the slits or the concave portion extend so as not to be parallel to the rotation direction c. Here, the length of the second upstream edge in the rotation axis direction a will be described further.

Figure 9:
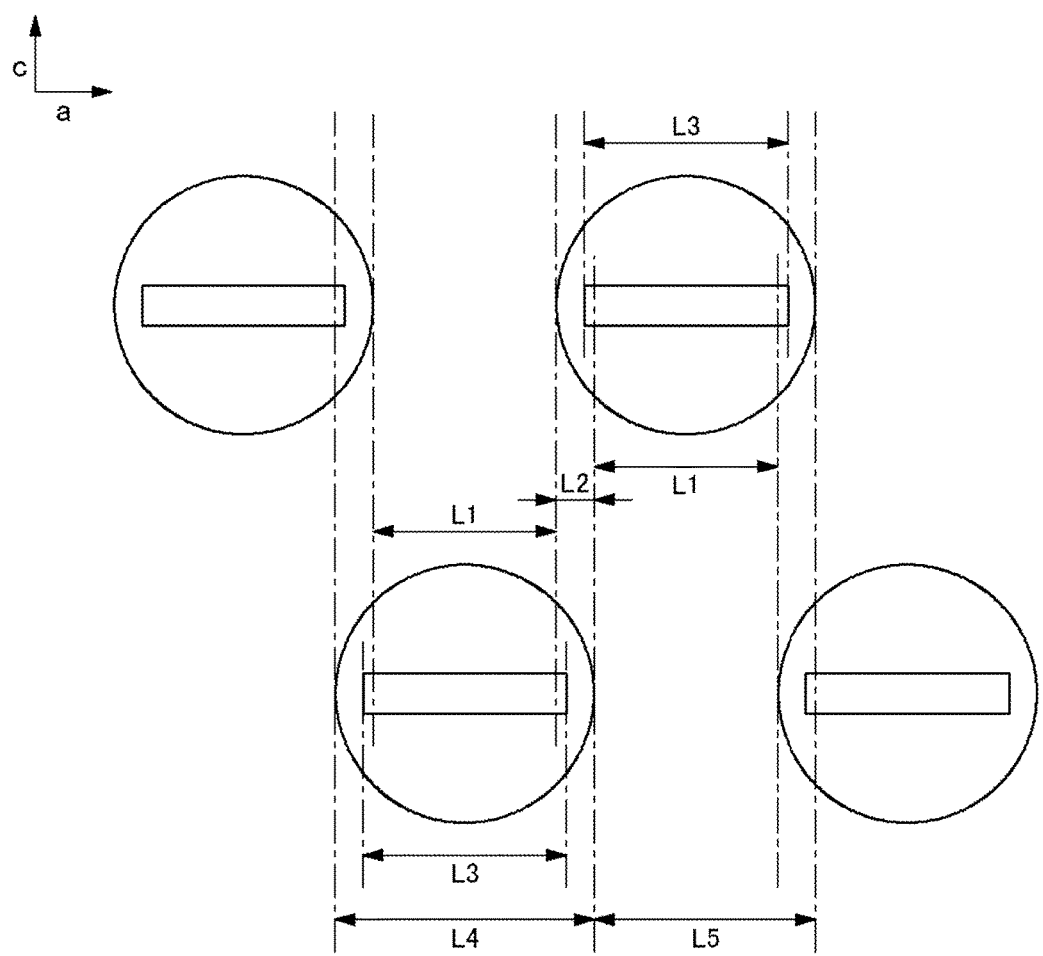
FIG. 9 is a diagram illustrating a relation in arrangement between a second upstream edge and a plurality of nodules of the first embodiment of the technology.

FIG. 9 is a diagram illustrating a relation in arrangement between the second upstream edge and the plurality of nodules. As described above, in the roll-type cleaning member 50 of the embodiment, the plurality of nodules 54 is arranged at the same interval in the rotation axis direction a, and the adjacent nodules 54 in the rotation direction c are deviated from each other by a half pitch in the rotation axis direction a. Further, the nodules 54 of the adjacent rows in the rotation axis direction a partially overlap one another. That is, the diameter L4 of the nodule 54 and the half pitch L5 of the nodule have a relation of L4>L5.

The overlap width L2 has a relation of L2=L4−L5. In the overlap portion, the substrate S is also scrubbed by the upper nodule 54 and the substrate S is also scrubbed by the lower nodule 54 of FIG. 9. On the contrary, in the non-overlap portion (the width has a relation of L1=L4−2×L2), the substrate S is scrubbed only by any one of the upper nodule 54 and the lower nodule 54 of FIG. 9 when the second upstream edge does not exist.

Here, it is desirable that the width L3 of the second upstream edge be larger than the width L1 of the non-overlap portion. That is, when the adjacent nodules 54 in the rotation direction c have an overlap portion in the rotation axis direction a, it is desirable that the second upstream edge have a length in which the non-overlap portion is covered in the rotation axis direction a. With this configuration, since two rows of nodules pass, two upstream edges also pass by whole of the non-overlap portion, and hence the non-overlap portion is more reliably cleaned.

Figure 10A:
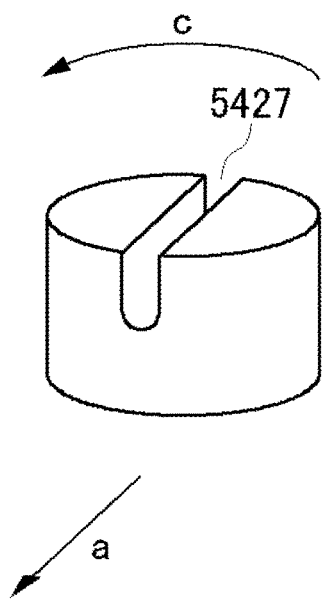
FIG. 10A is a diagram illustrating a modified example of a nodule of the first embodiment of the technology.
Figure 10B:
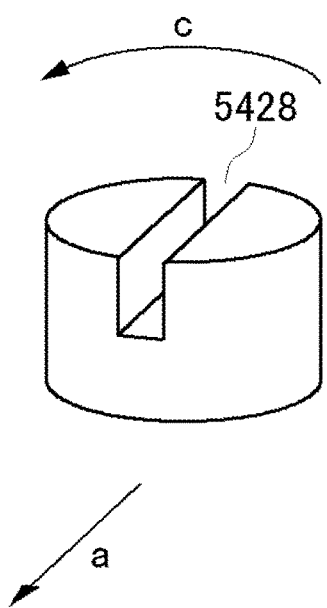
FIG. 10B is a diagram illustrating a modified example of a nodule of the first embodiment of the technology.

Next, modified examples of the slit will be described with reference to FIGS. 10 to 13. In the above-described embodiment, the slit is formed in a V-shape which is narrowed in the depth direction, but the width may be constant in the depth direction as in the slits 5427 and 5428 illustrated in FIGS. 10A and 10B. Further, the bottom of the slit may have a circular-arc shape as in the slit 5427 illustrated in FIG. 10A or may have a rectangular shape as in the slit 5428 illustrated in FIG. 10B. In addition to the slit, the width of the concave portion illustrated in FIGS. 8C to 8F may be narrowed in the depth direction or may be constant in the depth direction as illustrated in FIGS. 10A and 10B.

Figure 11A:
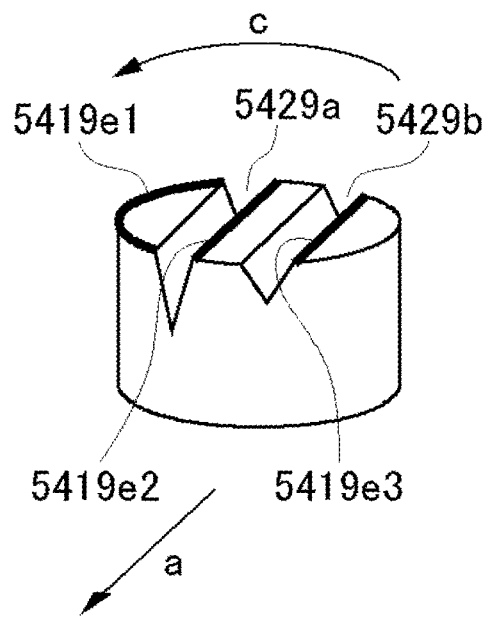
FIG. 11A is a diagram illustrating a modified example of a nodule of the first embodiment of the technology.
Figure 11B:
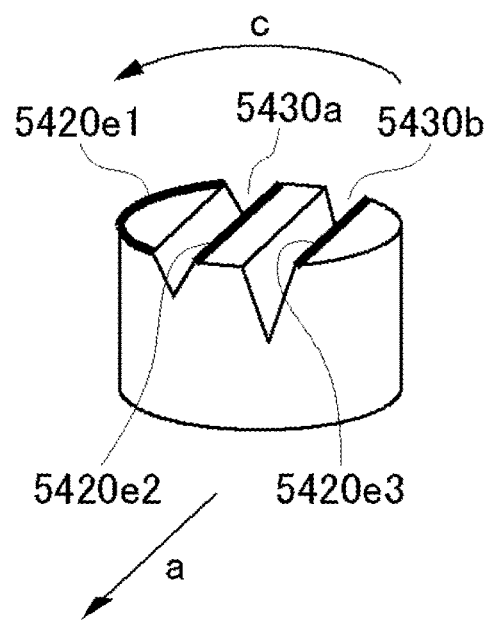
FIG. 11B is a diagram illustrating a modified example of a nodule of the first embodiment of the technology.

Further, as illustrated in FIGS. 11A and 11B, each nodule may be provided with a plurality of slits. In this case, three or more upstream edges are formed. That is, in the example of FIG. 11A, three upstream edges of a first upstream edge 5419e1, a second upstream edge 5419e2, and a third upstream edge 5419e3 are formed. Even in the example of FIG. 11B, three upstream edges of a first upstream edge 5420e1, a second upstream edge 5420e2, and a third upstream edge 5420e3 are formed.

The plurality of slits may have the same depth or may have a different depth as illustrated in FIGS. 11A and 11B. FIG. 11A illustrates an example in which an upstream slit 5429a is deeper than a downstream slit 5429b, and FIG. 11B illustrates an example in which an upstream slit 5430a is shallower than a downstream slit 5430b.

In this way, since the plurality of slits is formed in a different depth, the contact pressure applied from the plurality of upstream edges to the substrate S can be set differently. That is, when the downstream slit is shallow as illustrated in FIG. 11A, the contact pressure of the upstream edge at the downstream side becomes strong. Meanwhile, when the upstream slit is shallow as illustrated in FIG. 11B, the contact pressure of the upstream edge at the upstream side becomes strong. Any one of the upstream and downstream edges can be appropriately selected in response to, for example, the kind of the film of the substrate S, the removal target, the cleaning liquid, and the like.

Figure 12A:
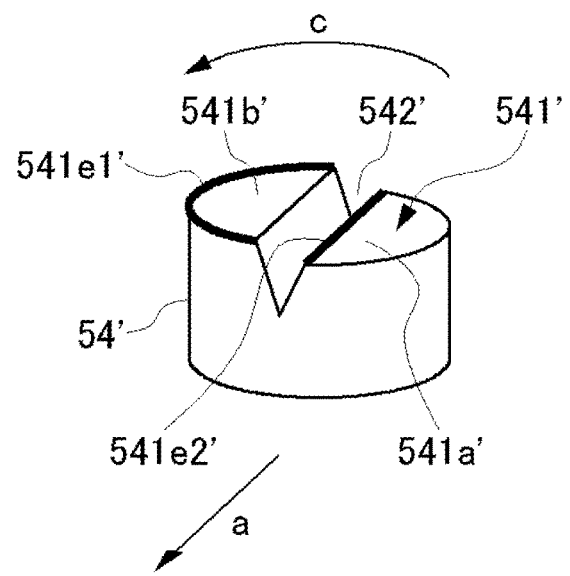
FIG. 12A is a diagram illustrating a modified example of a nodule of the first embodiment of the technology.
Figure 12B:
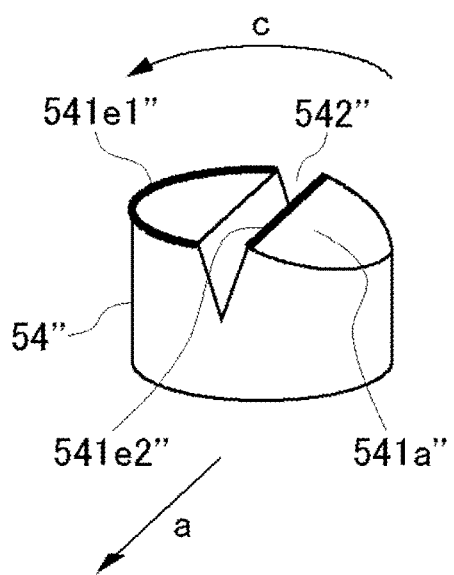
FIG. 12B is a diagram illustrating a modified example of a nodule of the first embodiment of the technology.

FIGS. 12A and 12B are diagrams illustrating another modified example of a nodule including a second upstream edge. As in a nodule 54' illustrated in FIG. 12A, a cleaning surface 541' may have a different height before and after a slit 542' in the rotation direction c. In this case, as illustrated in FIG. 12A, a contact surface 541b' at the upstream side (the side that contact the cleaning surface of the substrate S first) of the slit may be lower than a contact surface 541a' at the downstream side of the slit 542'. Further, as in a nodule 54" illustrated in FIG. 12B, a cleaning surface 541a" at the downstream of a slit 542" may be decreased in height from the slit 542" toward the downstream side.

According to the nodules 54' and 54", the first upstream edges 541e1' and 541e1" at the upstream side comparatively strongly scrub the front surface of the substrate S, and the second upstream edges 541e2' and 541e2" at the downstream side comparatively weakly scrub the front surface of the substrate S. According to the nodule 54", the contact surface 541a" at the downstream side (the escape side) is obliquely cut and the nodule 54" is separated from the substrate S while the contact pressure for the substrate S is weakened, the liquid inside the slit 542" is more reliably discharged.

Figure 13A:
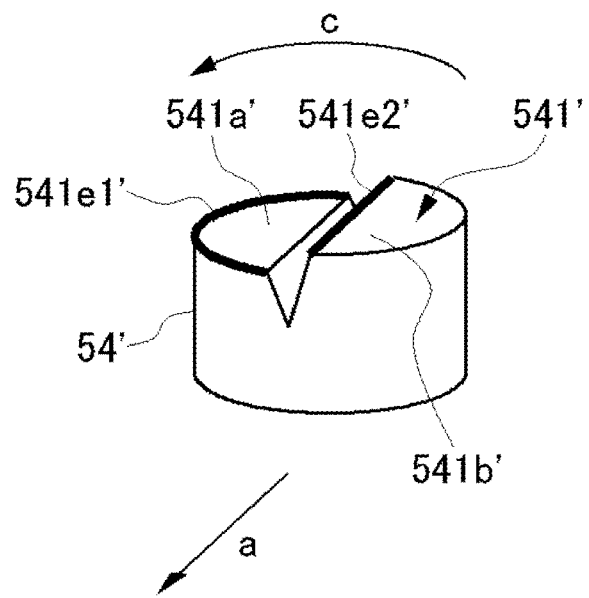
FIG. 13A is a diagram illustrating a modified example of a nodule of the first embodiment of the technology.
Figure 13B:
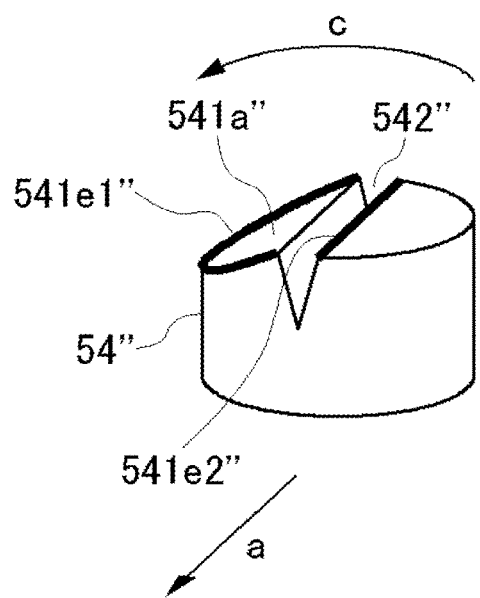
FIG. 13B is a diagram illustrating a modified example of a nodule of the first embodiment of the technology.

FIGS. 13A and 13B are diagrams illustrating another modified example of the nodule including the second upstream edge. The nodules 54' and 54" illustrated in FIGS. 13A and 13B are formed by reversing the upstream side and the downstream side of the nodules 54' and 54" illustrated in FIGS. 12A and 12B. According to these examples, the second upstream edges 541e2' and 541e2" at the downstream side of the first upstream edges 541e1' and 541e1" at the upstream side strongly contact the front surface of the substrate S. The contact pressure of the first upstream edge at the upstream side can be set to be strong as illustrated in FIGS. 12A and 12B or the contact pressure of the second upstream edge at the downstream side can be set to be strong as illustrated in FIGS. 13A and 13B depending on the kind of the film of the substrate S, the removal target, the cleaning liquid, and the like.

Figure 14:
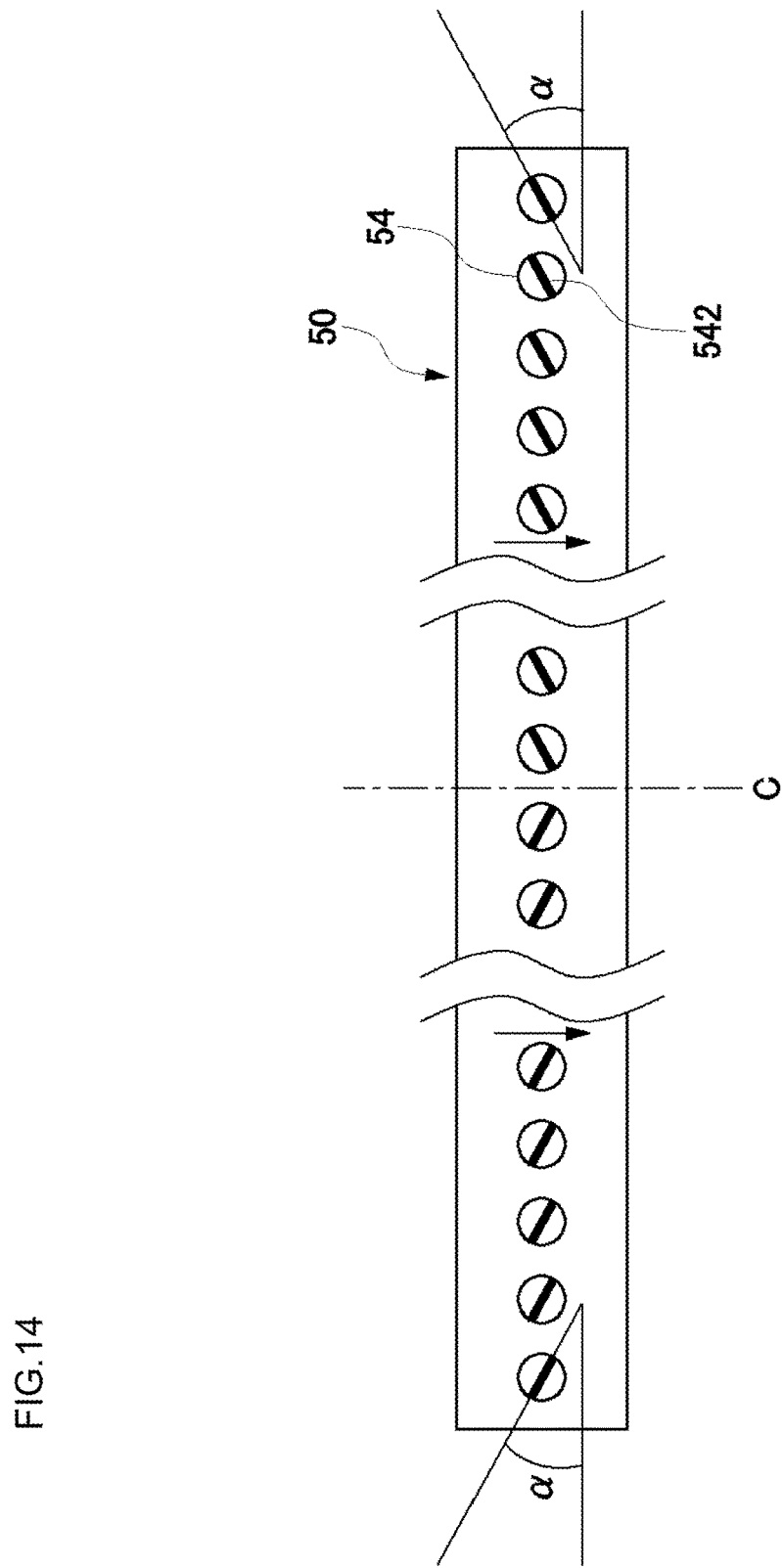
FIG. 14 is a diagram illustrating a modified example of a relation in direction between a slit formed in the nodule and a roll-type cleaning member of the first embodiment of the technology.

FIG. 14 is a diagram illustrating a modified example of a relation in direction between the roll-type cleaning member 50 and the slit 542 formed in the nodule 54. In FIG. 14, only one row of the nodules 54 are illustrated, and the other nodules are not illustrated in the drawings. In this example, the slit 542 of the nodule 54 is inclined with respect to the axis direction of the roll-type cleaning member 50. The inclination angle α can be set to, for example, 10° to 30°.

The arrow of FIG. 14 indicates a direction in which the nodule 54 moves with respect to the substrate. As illustrated in FIG. 14, the slit 542 is inclined so as to be located at the upstream side as it moves close to the center C of the roll-type cleaning member 50 in the longitudinal direction. As a result, in FIG. 14, the slit 542 of the nodule 54 at the left side of the center C is inclined upward and leftward, and the slit 542 of the nodule 54 at the right side of the center C is inclined upward and rightward.

Accordingly, when the second upstream edge contacts the substrate, the roll-type cleaning member 50 first contacts the substrate S from the center C of the rotation axis direction a of the roll-type cleaning member 50. Then, the dirty liquid inside the slit 542 is discharged from the slit 542 in a direction from the center C of the rotation axis direction a of the roll-type cleaning member 50 outward by the movement of the nodule 54. In addition, the inclination angle α of the slit 542 with respect to the rotation axis direction a of the roll-type cleaning member 50 may be set in response to the rotation speed of the roll-type cleaning member 50. Further, the inclination angle α may not be constant in the rotation axis direction a of the roll-type cleaning member 50, but may have a distribution.

2. Second Embodiment

Substrate Cleaning Apparatus Including Pencil-Type Cleaning Member

Figure 15:
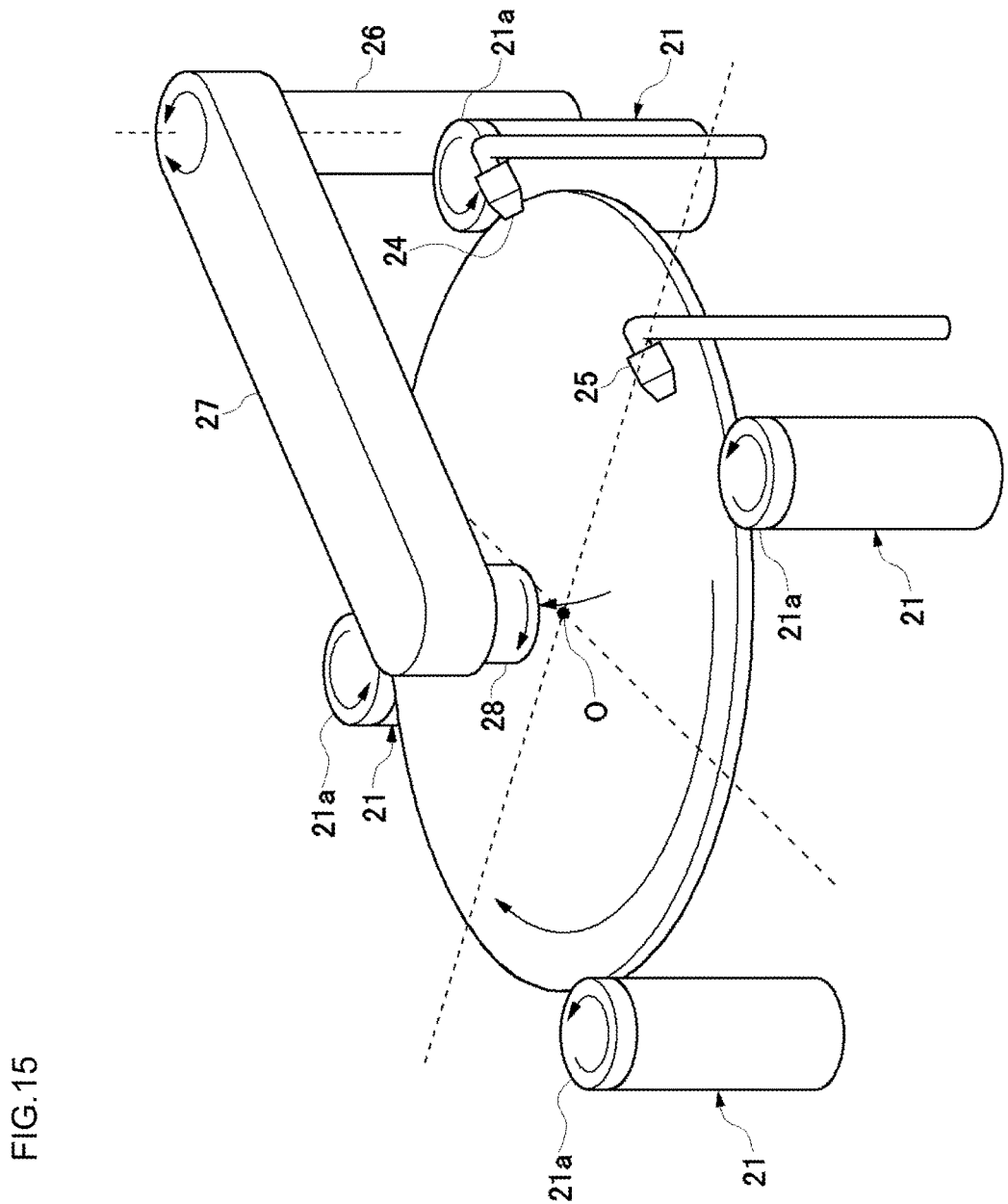
FIG. 15 is a perspective view illustrating an outline of a substrate cleaning apparatus of a second embodiment of the technology.

FIG. 15 is a perspective view illustrating an outline of a substrate processing apparatus (a substrate cleaning apparatus) according to a second embodiment. As illustrated in FIG. 15, a substrate cleaning apparatus 20 includes a plurality of (in FIG. 15, four) spindles 21 (substrate holders) which serves as substrate rotation mechanisms movable in the horizontal direction, supports the circumferential edge of the substrate S so that the front surface of the substrate is directed upward, and rotates the substrate S in the horizontal direction, a column 26 which extends in the vertical direction so as to be elevatable, a swing arm 27 of which one end is rotatably attached to the front end of the column 26 and which extends in the horizontal direction, and a columnar pencil-type cleaning member 28 (a columnar sponge) which is rotatably attached to the lower surface of the other end of the swing arm 27. Further, two cleaning liquid supply nozzles 24 and 25 are located above the substrate S supported and rotated by a spin chuck 21a of a spindle 21 so as to supply the cleaning liquid to the front surface of the substrate S. The cleaning liquid supply nozzle 24 is a nozzle which supplies the rinse liquid (for example, the superpure water) to the front surface of the substrate S, and the cleaning liquid supply nozzle 25 is a nozzle which supplies the chemical liquid to the front surface of the substrate S.

The pencil-type cleaning member 28 is held by a holding member (not illustrated), is rotatably provided in the lower surface of the front end of the swing arm 27, and is rotated (spun) by a driving mechanism (not illustrated) so that the axis is the rotation axis. The rotation axis is perpendicular to the substrate S. The pencil-type cleaning member 28 is formed of, for example, polyurethane foam or PVA. When the swing arm 27 rotates about the column 26, the pencil-type cleaning member 28 attached to the front end of the swing arm 27 moves on the substrate S while depicting a circular-arc path. Since the front end of the swing arm 27 extends to the center O of the substrate S, the movement path of the pencil-type cleaning member 28 passes through the center O of the substrate S. Further, the pencil-type cleaning member 28 is moved to the outer circumference of the substrate S. Thus, the movement path of the pencil-type cleaning member 28 formed by the rotation of the swing arm 27 becomes a circular-arc shape having a radius as the length of the swing arm 27, and the movement range is a range from the outer circumference of the substrate S to the center O of the substrate S.

At this time, the rinse liquid is supplied from the cleaning liquid supply nozzle 24 to the front surface of the substrate S and the chemical liquid is supplied from the cleaning liquid supply nozzle 25 to the front surface of the substrate S while the substrate S is rotated in the horizontal direction by the substrate rotation mechanism. In this state, the swing arm 27 is rotated so as to revolve while the pencil-type cleaning member 28 is rotated (spun) and the pencil-type cleaning member 28 contacts the front surface of the rotating substrate S. Accordingly, the front surface of the substrate S is scrub-cleaned by the pencil-type cleaning member 28 under the presence of the cleaning liquid (the rinse liquid and the chemical liquid).

Figure 16:
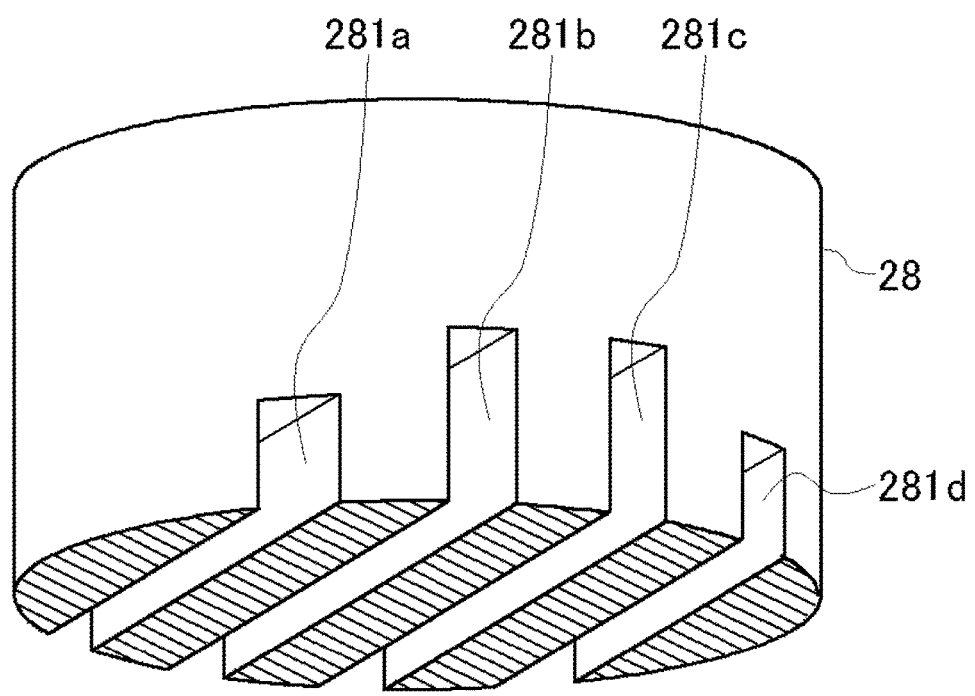
FIG. 16 is a perspective view of a pencil-type cleaning member of the second embodiment of the technology.
Figure 17A:
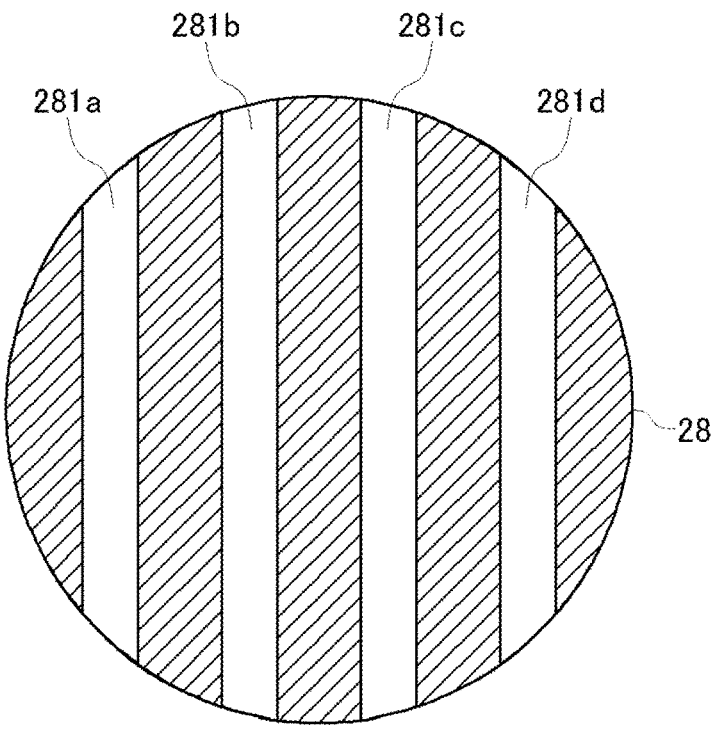
FIG. 17A is a bottom view of the pencil-type cleaning member of the second embodiment of the technology.
Figure 17B:
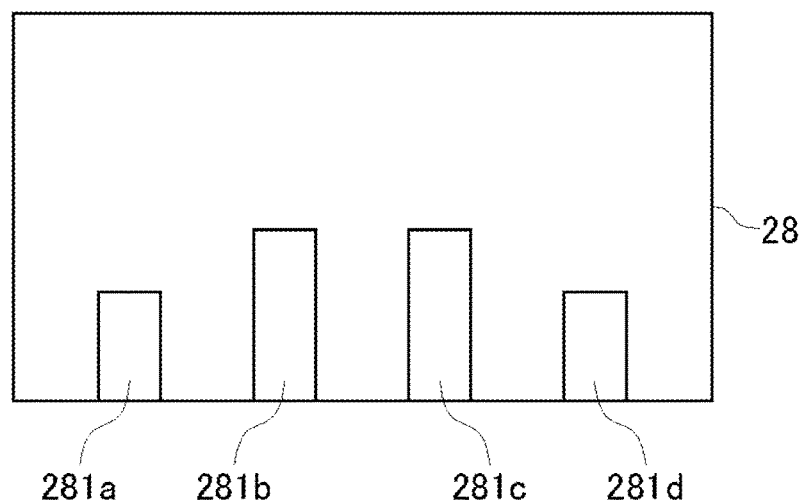
FIG. 17B is a front view of the pencil-type cleaning member of the second embodiment of the technology.

FIG. 16 is a perspective view of the pencil-type cleaning member 28, FIG. 17A is a bottom view of the pencil-type cleaning member 28, and FIG. 17B is a front view of the pencil-type cleaning member 28. In FIGS. 16 and 17A, the cleaning surface is formed in a hatching shape. As illustrated in FIGS. 16, 17A, and 17B, the pencil-type cleaning member 28 is provided with a plurality of (in the embodiment, four) slits 281a to 281d which continues from one edge to the other edge as a plurality of parallel lines. The slits 281a to 281d are formed while not being divided between the edges of the pencil-type cleaning member 28. Further, the depth of the slit becomes deeper as it moves close to the slit near the center of the pencil-type cleaning member 28. Specifically, in the pencil-type cleaning member 28 of the embodiment, the inner slits 281b and 281c are deeper than the outer slits 281a and 281d. Further, in the above-described example, the slits 281a to 281d are formed in a linear shape having a constant width, but may be formed in a curve shape or a shape having a non-constant width.

Figure 18:
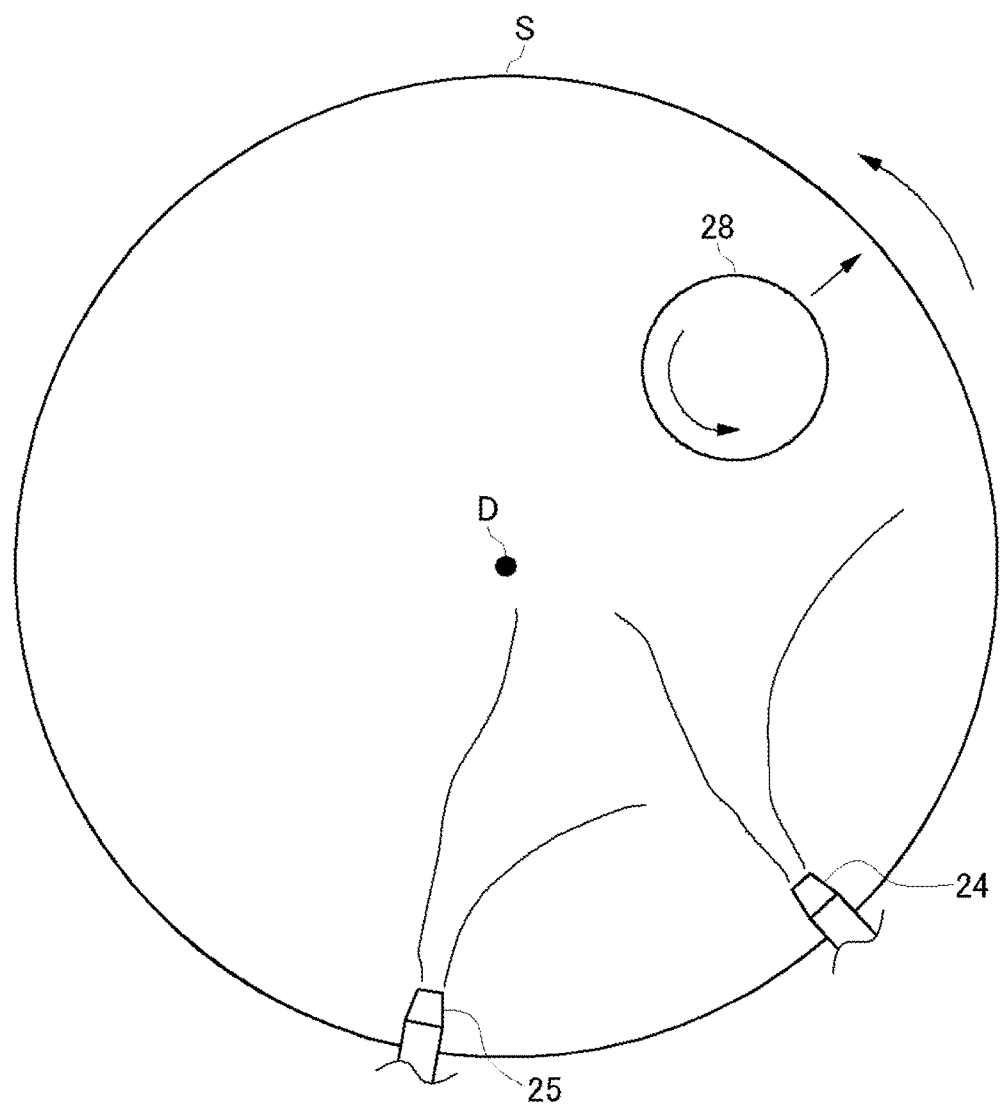
FIG. 18 is a top view illustrating a relation between the pencil-type cleaning member and the substrate of the second embodiment of the technology.

FIG. 18 is a top view illustrating a relation between the substrate S and the pencil-type cleaning member 28. As described above, the substrate S rotates about the axis, and the pencil-type cleaning member 28 moves on the radial path including the center of the substrate S while rotating about the axis. In the embodiment, it is assumed that the rotation direction of the substrate S and the rotation direction of the pencil-type cleaning member 28 are equal to each other and both the substrate and the pencil-type cleaning member rotate in the counter-clockwise direction in the top view.

The substrate S may have a diameter of 300 mm or a diameter of 450 mm. The rotation speed of the substrate S is 250 to 2000 rpm. The specific rotation speed of the substrate S is determined in consideration of the specification of the spindle 21 or the size of the substrate S. The rotation speed of the pencil-type cleaning member 28 about the axis is 0 to 400 rpm and typically 150 to 300 rpm. The specific rotation speed of the pencil-type cleaning member 28 is determined in consideration of the size of the substrate S and the size of the pencil-type cleaning member 28. The swing speed of the pencil-type cleaning member 28 (the rotation speed of the swing arm 27) is 2 to 150 mm/sec, and is determined in consideration of the rotation speed of the substrate S, the size of the substrate S, the rotation speed of the pencil-type cleaning member 28, and the demanded throughput.

The pencil-type cleaning member 28 may scrub-clean the entire front surface of the substrate S by the parallel edge-edge swing of the swing arm 27 moving from one edge of the substrate S to the other edge through the center O of the substrate S. In this case, the pencil-type cleaning member 28 may scrub-clean the entire front surface of the substrate S by the reciprocating swing in which the pencil-type cleaning member 28 reaches the other edge, moves in the opposite direction, and returns to one edge through the center O of the substrate S. Alternatively, the pencil-type cleaning member 28 may scrub-clean the entire front surface of the substrate S by the repeated movement in which the pencil-type cleaning member 28 reaches the other edge, is lifted upward from the front surface of the substrate S, is returned to a position above one edge, is brought into contact with the front surface of the substrate S, and is moved in parallel from one edge of the substrate S to the other edge through the center O of the substrate S by the swing of the swing arm 27. The swing arm 27 may swing one to ten times in order to clean one substrate S.

Further, the pencil-type cleaning member 28 may scrub-clean the entire front surface of the substrate S by the center-edge swing in which the pencil-type cleaning member is moved in parallel from the center of the substrate S to the edge of the substrate S by the swing of the swing arm 27. Even in this case, the pencil-type cleaning member 28 may move to the center O of the substrate S by the movement in the opposite direction after the pencil-type cleaning member 28 reaches the edge. Alternatively, the pencil-type cleaning member 28 may be operated repeatedly such that the pencil-type cleaning member 28 is lifted upward from the front surface of the substrate S after the pencil-type cleaning member 28 reaches the edge, is returned to a position above the center O of the substrate S, is brought into contact with the front surface of the substrate S, and is moved in parallel from the center O of the substrate S to the edge by the swing of the swing arm 27. Even in this case, the swing arm 27 may swing one to ten times in order to clean one substrate S.

The liquid (the pure water and the rinse liquid) which is supplied from the cleaning liquid supply nozzles 24 and 25 to the center of the substrate S lands on the front surface of the substrate S, and is dispersed on the front surface of the rotating substrate S in the radial direction by the inertia in the supply direction (the direction toward the center of the substrate S) and the centrifugal force (the direction toward the edge of the substrate S) generated by the rotation of the substrate S as illustrated in FIG. 18. In this way, a liquid supplied portion in the front surface of the substrate S reaches a cleaning portion formed by the scrubbing of the substrate S and the pencil-type cleaning member 28 due to the rotation of the substrate S, and the substrate S is scrub-cleaned by the pencil-type cleaning member 28 at the cleaning portion under the presence of the pure water and the rinse liquid.

FIGS. 19A to 19D are enlarged views of the cleaning portion. FIGS. 19A to 19D illustrate a state where the pencil-type cleaning member 28 rotates, and also illustrate the slits 281a to 281d of the pencil-type cleaning member 28. Further, in the pencil-type cleaning member 28 of FIGS. 19A to 19D, the side surface provided with one end of each of the plurality of slits 281a to 281d is indicated by H1, and the side surface provided with the other end thereof is indicated by H2.

Figure 19A:
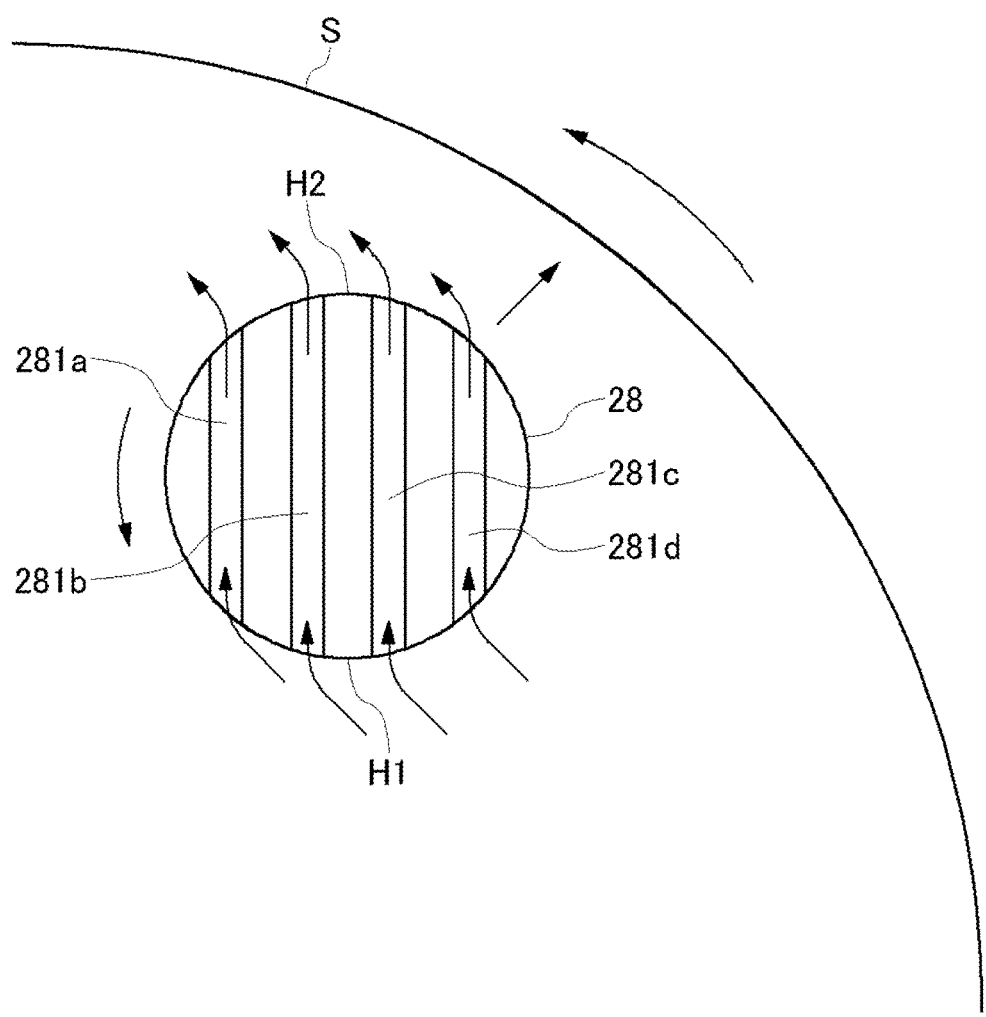
FIG. 19A is an enlarged view of a cleaning portion of the second embodiment of the technology (0°).
Figure 19B:
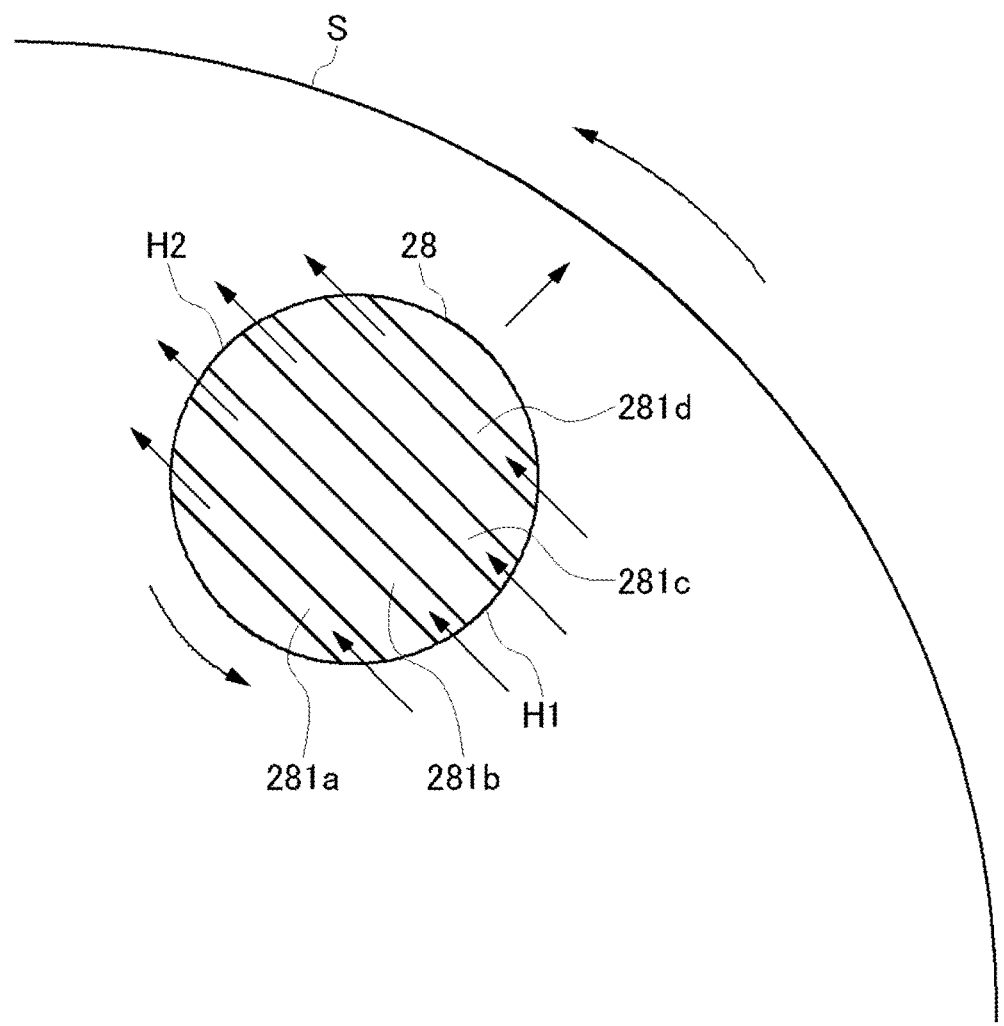
FIG. 19B is an enlarged view of the cleaning portion of the second embodiment of the technology (45°).
Figure 19C:
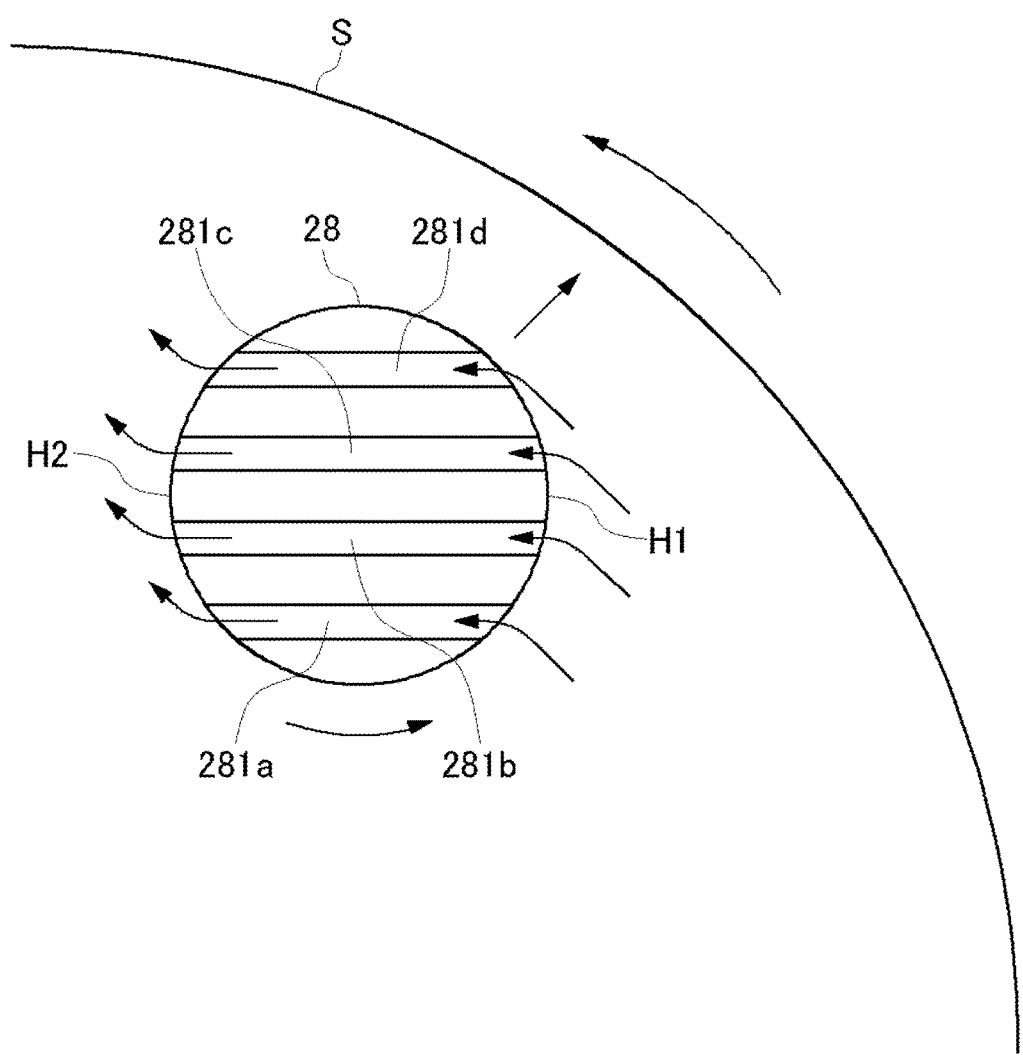
FIG. 19C is an enlarged view of the cleaning portion of the second embodiment of the technology (90°).
Figure 19D:
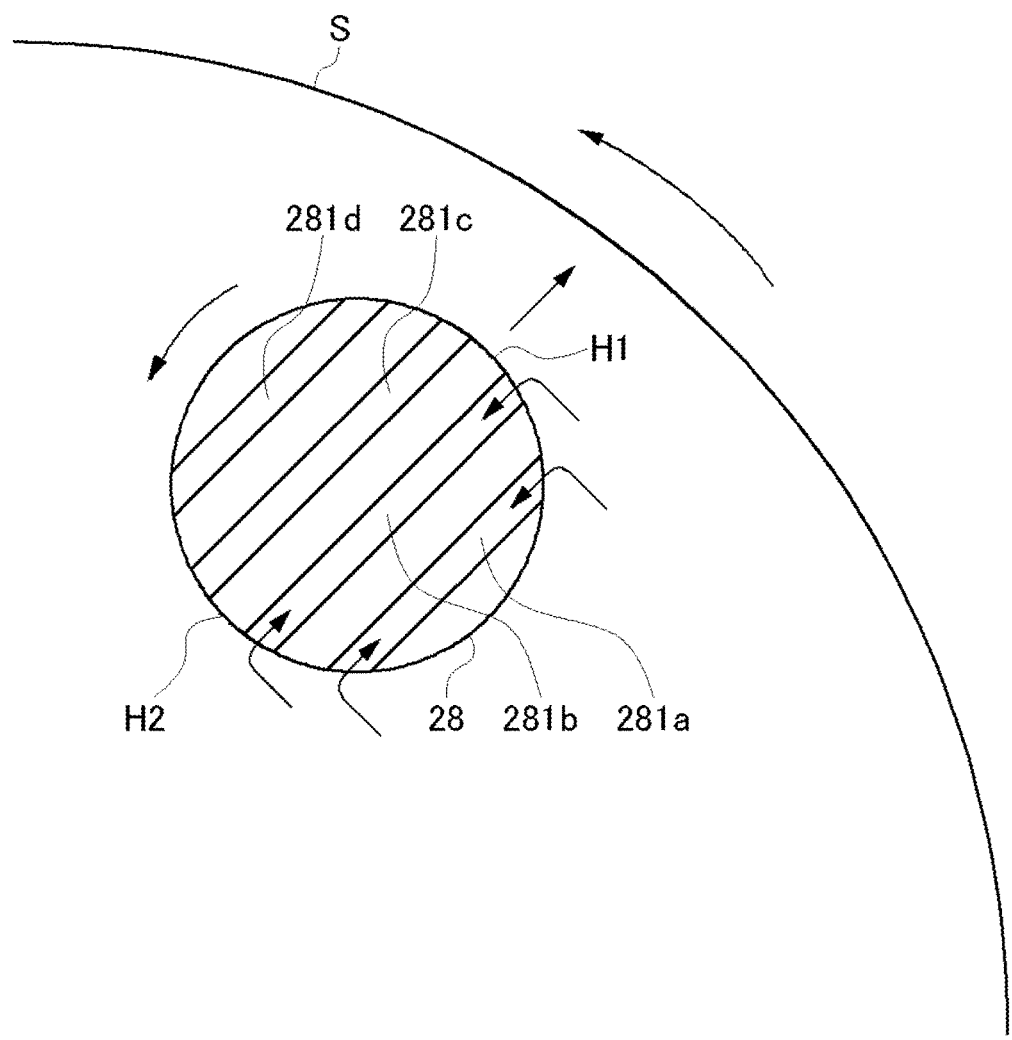
FIG. 19D is an enlarged view of the cleaning portion of the second embodiment of the technology (135°).

When the rotation angle of FIG. 19A is set to 0°, the rotation angles of FIGS. 19B, 19C, and 19D are respectively set to 45°, 90°, and 135°. As illustrated in FIGS. 19A to 19D, in the rotation angle of 0 to 180°, the liquid flows into the slit from the end of the side surface H1 of the slits 281a to 281d, and the liquid inside the slit flows out of the end of the side surface H2. That is, when the rotation angle of the pencil-type cleaning member 28 is from 0 to 180°, the liquid flows through each of the slits 281a to 281d in a constant direction (a direction from the side surface H1 to the side surface H2).

FIGS. 20A to 20D illustrate states where the rotation angles are 180°, 225°, 270°, and 315° on the assumption that the rotation angle of the pencil-type cleaning member 28 of FIG. 19A is set to 0°. As illustrated in FIGS. 20A to 20D, when the rotation angle of the pencil-type cleaning member 28 is from 180 to 360°, the liquid flows through each of the slits 281a to 281d in a constant direction (a direction from the side surface H2 to the side surface H1).

As obvious from FIGS. 19A to 19D and FIGS. 20A to 20D, the liquid flows through the slits 281a to 281d in a direction from the side surface H1 toward the side surface H2 by the half revolution while the pencil-type cleaning member 28 rotates once, and the liquid flows through the slits 281a to 281d in the opposite direction, that is, a direction from the side surface H2 toward the side surface H1 by the other half revolution. Accordingly, the liquid is sufficiently circulated in the slit so that a fresh liquid is supplied to the slit at all times.

Further, in the pencil-type cleaning member 28 of the embodiment, the slits 281a to 281d are formed on the bottom surface while not being divided from one edge to the other edge. Accordingly, the liquid flowing into the slit does not stay inside the slit unlike when the liquid is divided and not discharged to the outside. For this reason, a fresh liquid is supplied into the slit at all times.

Further, since the slits 281a to 281d are formed on the bottom surface of the pencil-type cleaning member 28, the edge is formed at both sides. Since the pencil-type cleaning member 28 rotates about the axis and moves in parallel in the radial direction of the substrate S and the substrate S also rotates about the axis, any portion of the slits 281a to 281d may be the upstream edge. In any case, one of both sides of each of the slits 281a to 281d becomes the upstream edge. Accordingly, the cleaning effect is improved by the same principle as the first embodiment compared with the case where the slits 281a to 281d are not formed.

In the above-described embodiment, the pencil-type cleaning member 28 is rotated in the same direction as the substrate S. In this case, the front surface of the substrate S and the bottom surface of the pencil-type cleaning member 28 move in the same direction (the forward direction or the follow direction) at the outside of the substrate S in the radial direction of the cleaning portion formed by the contact between the pencil-type cleaning member 28 and the substrate S, and the front surface of the substrate S and the bottom surface of the pencil-type cleaning member 28 move in the opposite direction (the opposed direction or the counter direction) at the inside of the substrate in the radial direction at the cleaning portion. Here, the cleaning effect is increased comparatively at the portion (the inside of the substrate S in the radial direction) in which the front surface of the substrate S and the bottom surface of the pencil-type cleaning member 28 move in the opposed direction at the cleaning portion, and the cleaning effect is decreased comparatively at the portion (the outside of the substrate S in the radial direction) in which the front surface of the substrate S and the bottom surface of the pencil-type cleaning member 28 move in the forward direction.

Further, the pencil-type cleaning member 28 may be rotated in the opposite direction to the substrate S. In this case, the front surface of the substrate S and the bottom surface of the pencil-type cleaning member 28 move in the opposite direction at the outside of the substrate S in the radial direction in the cleaning portion, and the front surface of the substrate S and the bottom surface of the pencil-type cleaning member 28 move in the forward direction at the inside of the substrate S in the radial direction at the cleaning portion. Thus, the cleaning effect is increased comparatively at the outside of the substrate S in the radial direction at the cleaning portion, and the cleaning effect is decreased comparatively at the inside of the substrate S in the radial direction at the cleaning portion.

Further, the pencil-type cleaning member 28 may not be rotated. In this case, as illustrated in FIGS. 19A and 20A or FIGS. 19C and 20C, the pencil-type cleaning member 28 may be fixed so that the slits 281a to 281d form an angle in any one of the radial direction and the circumferential direction of the substrate S. In these cases, the liquid enters each of the slits 281a to 281d from the upstream side in the rotation direction of the substrate S, and is discharged from the opposite side.

Figure 20A:
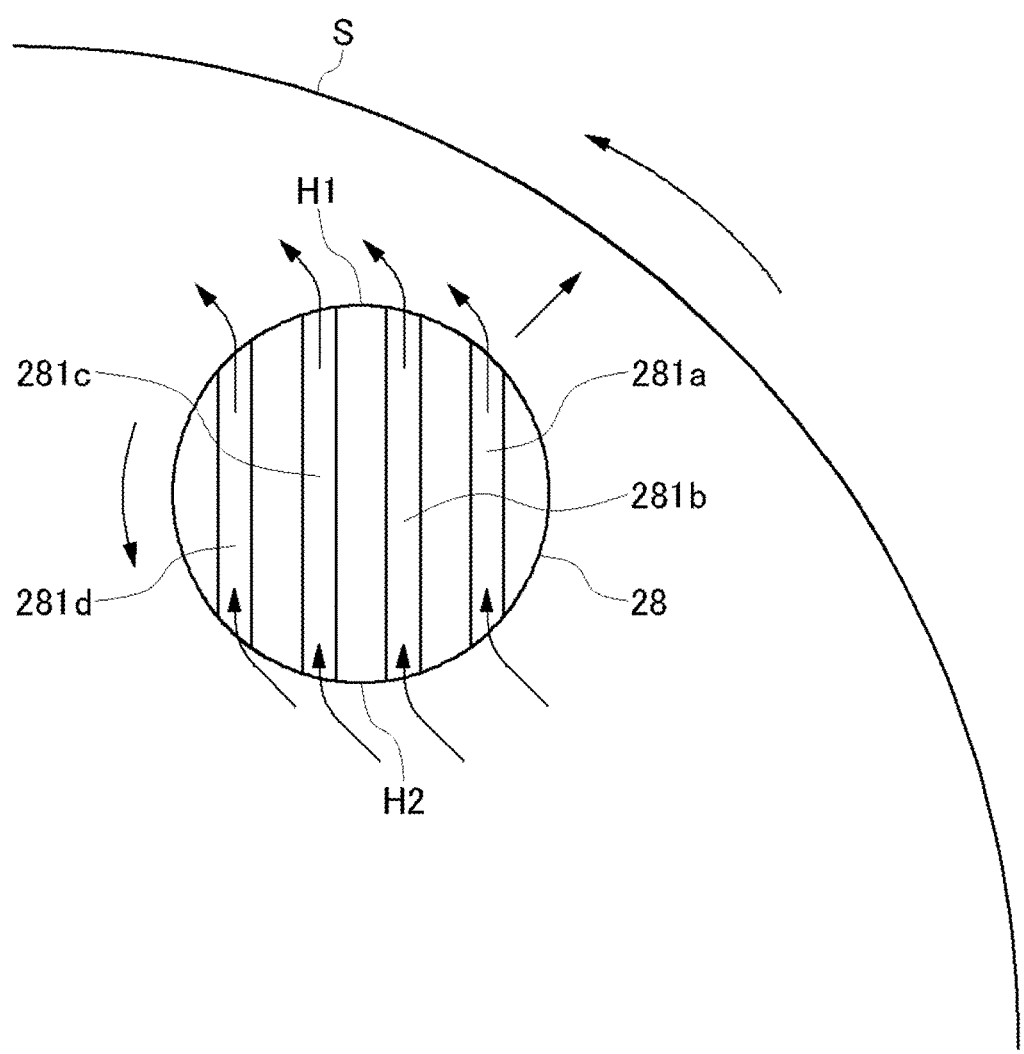
FIG. 20A is an enlarged view of the cleaning portion of the second embodiment of the technology (180°).

When the pencil-type cleaning member 28 is fixed in the direction of FIGS. 19A and 20A, the left edge of each of the slits 281a to 281d becomes the upstream edge, and hence the cleaning effect is improved. Further, when the pencil-type cleaning member is fixed in the direction of FIGS. 19C and 20C, the upper edge of each of the slits 281a to 281d becomes the upstream edge, and hence the cleaning effect is improved. In this way, when the pencil-type cleaning member 28 is fixed in the direction of FIGS. 19A and 20A or FIGS. 19C and 20C, there is a merit that the liquid is circulated inside the slit and the cleaning effect is improved by the plurality of upstream edges.

Figure 20B:
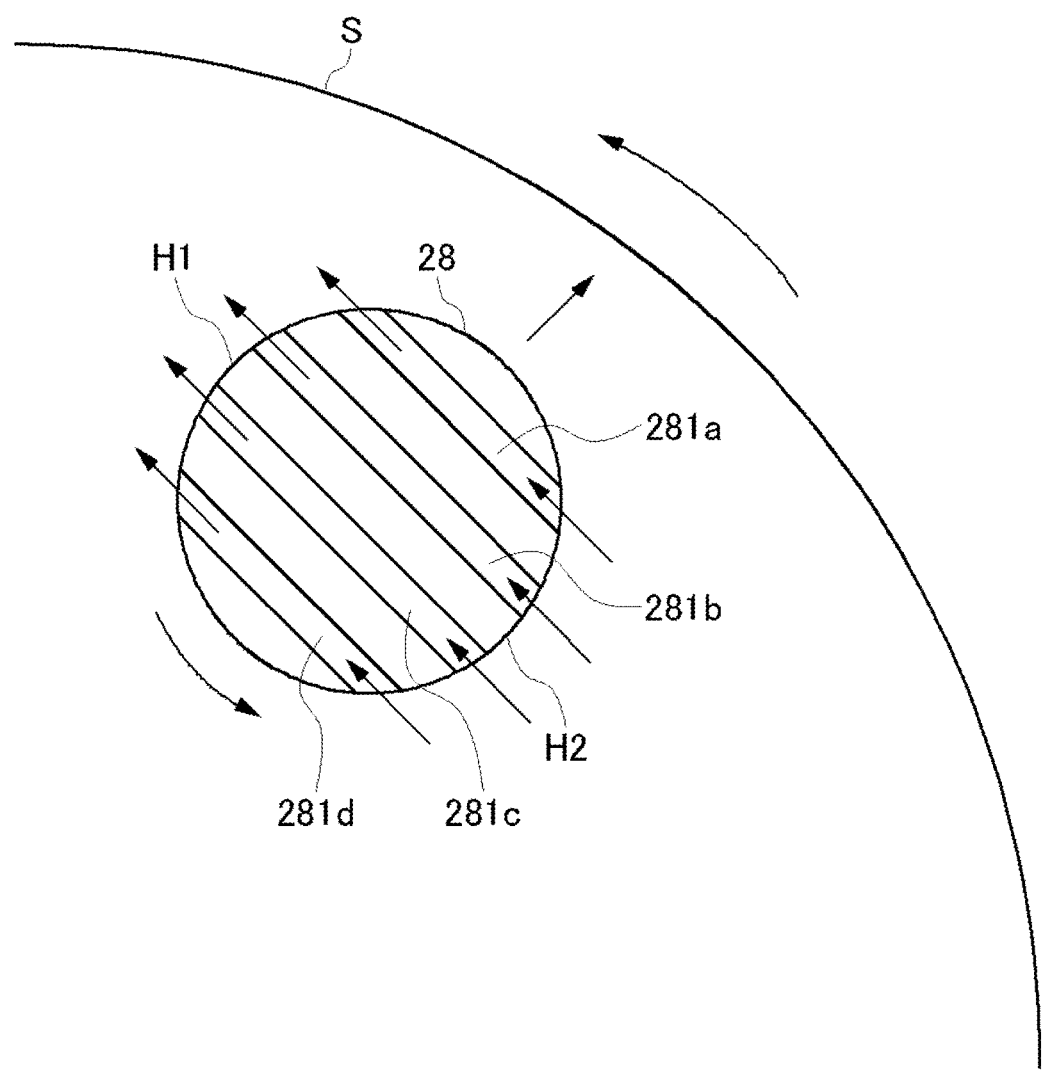
FIG. 20B is an enlarged view of the cleaning portion of the second embodiment of the technology (225°).
Figure 20C:
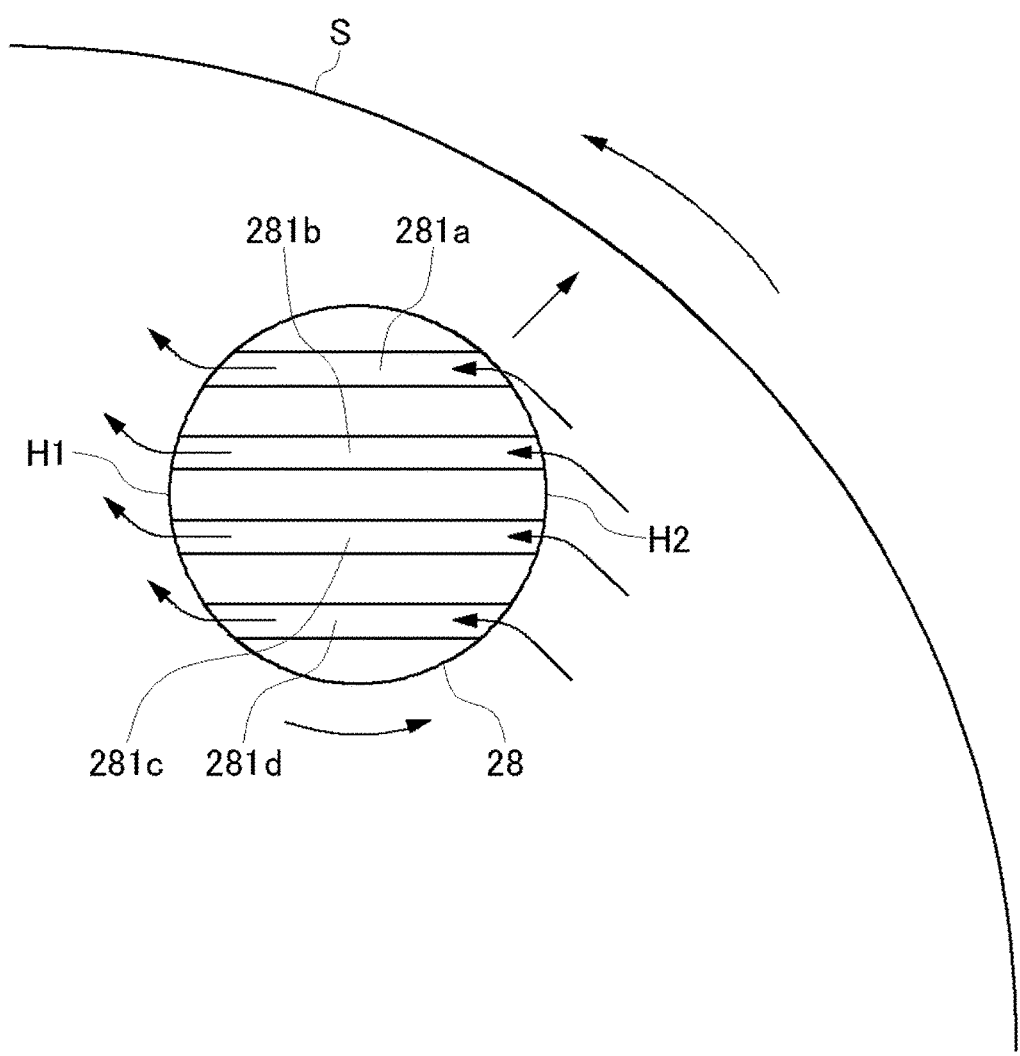
FIG. 20C is an enlarged view of the cleaning portion of the second embodiment of the technology (270°).

When the pencil-type cleaning member 28 is not rotated, the pencil-type cleaning member 28 may be fixed in a direction in which the slits 281a to 281d are substantially perpendicular to the radial direction of the substrate S and are substantially parallel to the circumferential direction thereof as illustrated in FIGS. 19B and 20B. In this case, the cleaning effect of the plurality of upstream edges is improved only by the movement (swing) of the pencil-type cleaning member 28 in the radial direction of the substrate S. However, there is an advantage in that the liquid smoothly flows through each of the slits 281a to 281d and a fresh liquid is supplied into each of the slits 281a to 281d compared with the other examples.

Figure 20D:
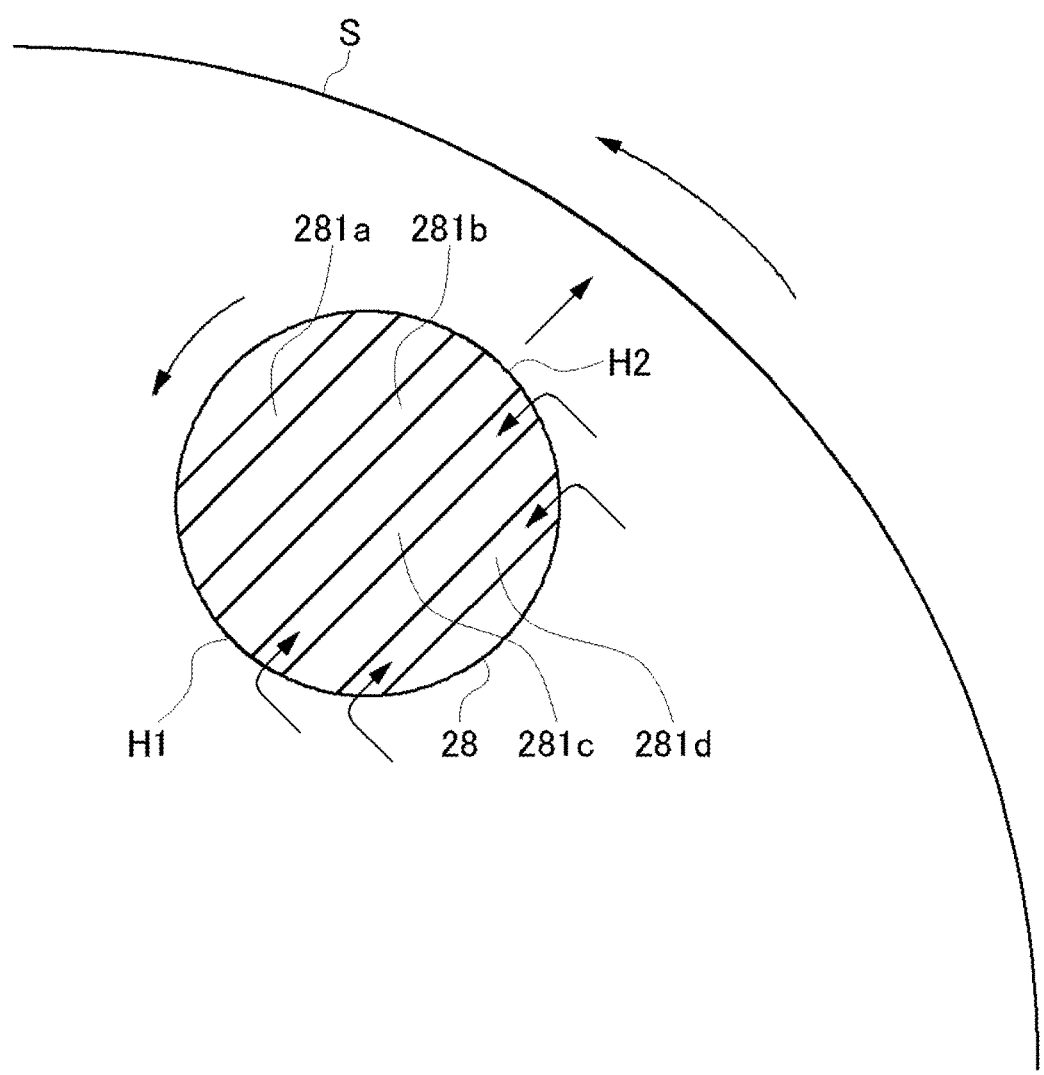
FIG. 20D is an enlarged view of the cleaning portion of the second embodiment of the technology (315°).

Further, when the pencil-type cleaning member 28 is not rotated, the pencil-type cleaning member 28 may be fixed in a direction in which the slits 281a to 281d are substantially parallel to the radial direction of the substrate S and are substantially perpendicular to the circumferential direction thereof as illustrated in FIGS. 19D and 20D. In this case, the liquid is circulated in each of the slits 281a to 281d mainly by the movement (swing) of the pencil-type cleaning member 28 in the radial direction of the substrate S. However, there is an advantage in that the cleaning effect of the plurality of upstream edges is improved compared with the other examples.

Further, in the above-described embodiment, four slits are formed on the bottom surface of the pencil-type cleaning member 28, but the number of the slits formed on the bottom surface of the pencil-type cleaning member 28 may be one to three or five or more. For example, other concave portions such as a circular concave portion may be formed in addition to the slit which is formed while not being divided from one edge to the other edge.

3. Third Embodiment

Substrate Cleaning Apparatus Including Pencil-Type Buff Processing Member

In the above-described first and second embodiments, an example has been described in which the technology is applied to the substrate cleaning apparatus, but the technology can be also applied to a buff processing apparatus which performs a buff processing treatment on a polished substrate. That is, the technology can be applied to a buff processing apparatus as well as a substrate cleaning apparatus that uses a sponge material of PVA. Here, the buff processing treatment includes at least one of a buff polishing treatment and a buff cleaning treatment. The buff processing apparatus may be integrated with or separated from a polishing apparatus.

The buff polishing treatment indicates a processing treatment of relatively moving a substrate and a buff processing pad while bringing the buff processing pad into contact with the substrate, and polishing and removing a substrate processing surface through slurry (polishing liquid) between the substrate and the buff processing pad. In general, the buff polishing treatment indicates a processing treatment which is performed as a final polishing treatment after a main polishing treatment performed to flatten unevenness of a surface of a substrate or remove an extra film formed on a surface other than an inner surface of a trench or a via. By the buff polishing treatment, a scratch or foreign matter on a surface of a substrate can be removed, a portion not removed by a main polishing treatment can be additionally removed, or morphology obtained after a main polishing treatment can be improved.

Meanwhile, the buff cleaning treatment indicates a finishing treatment performed to reform a surface of a substrate or remove foreign matter on a surface of a substrate by relatively moving a substrate and a buff processing pad while bringing the buff processing pad into contact with the substrate through a cleaning processing liquid (a chemical liquid and/or pure water) between the substrate and the buff processing pad. In the buff cleaning treatment, a strong physical force is applied to a substrate compared with a cleaning treatment using a soft sponge material of PVA. By the use of the buff cleaning treatment, largely adhesive foreign matter which is not removed only by the contact of the sponge material of PVA can be effectively cleaned and removed.

Figure 21:
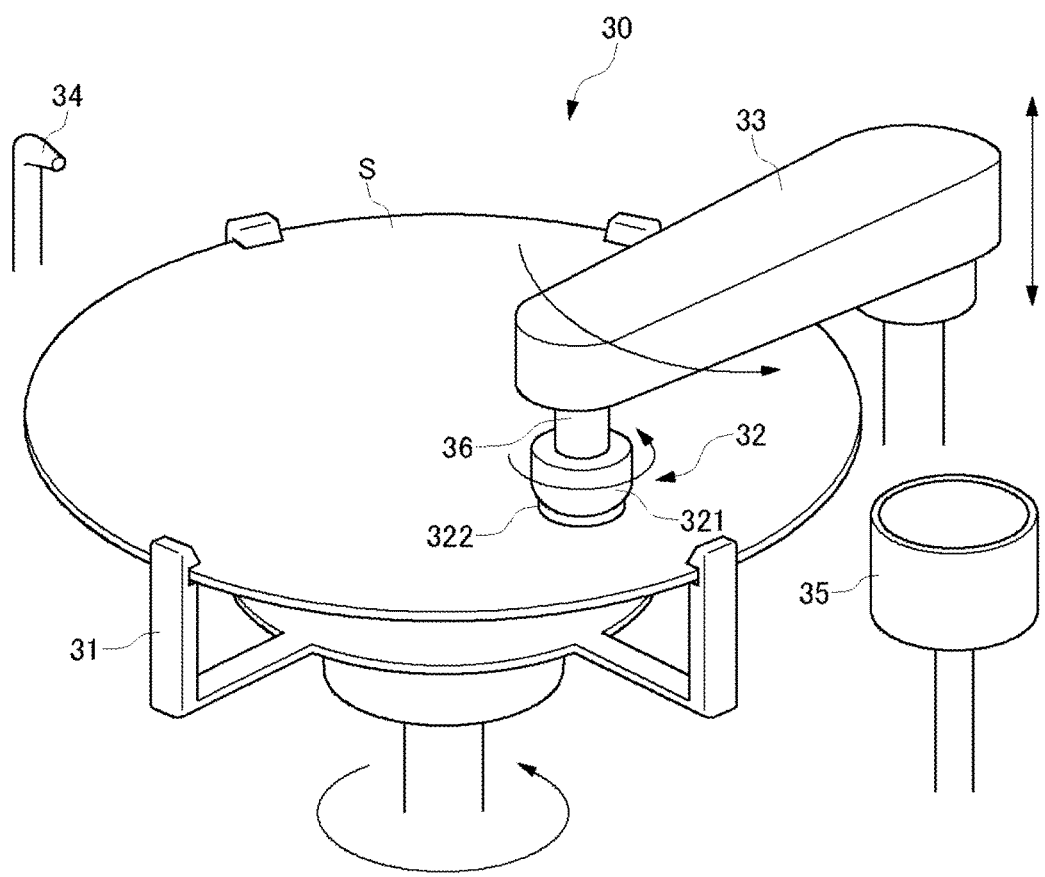
FIG. 21 is a perspective view illustrating an outline of a buff processing apparatus of a third embodiment of the technology.

FIG. 21 is a perspective view illustrating an outline of a buff processing apparatus of a third embodiment. A buff processing apparatus 30 includes a spin chuck 31 which horizontally rotates the substrate S at a rotation speed necessary for holding the substrate, a rotatable pencil-type buff processing member 32 that is formed by attaching a cleaning member having microscopic holes formed on a surface and formed of polyurethane foam, an elevatable swing arm 33 which holds the pencil-type buff processing member 32 at a front end thereof, a cleaning liquid nozzle 34 which injects a cleaning liquid to the surface of the substrate S, and a cleaning cup 35 which cleans a cleaning tool. The pencil-type buff processing member 32 is supported by the front end of the swing arm 33 through a rotation shaft 36, and is rotated at a predetermined rotation speed. The pencil-type buff processing member 32 includes a base portion 321 which is fixed to the rotation shaft 36 and a buff processing pad 322 which is attached to the lower portion thereof so as to form the bottom surface of the pencil-type buff processing member 32.

Comparatively large particles are dropped from the substrate S through scrub-cleaning by rinse cleaning or brush cleaning, and the substrate S is carried into the buff processing apparatus 30. The substrate S is held by the spin chuck 31 while the front surface is exposed upward. The held substrate S is rotated at a predetermined rotation speed and the cleaning liquid is injected from the cleaning liquid supply nozzle 34 to the center of the substrate S.

In the swing arm 33, a downward movement position in which the pencil-type buff processing member 32 is received in the cleaning cup 35 is set to an initial position. Then, the pencil-type buff processing member 32 is self cleaned while rotating inside the cleaning cup 35 filled with the cleaning liquid. The swing arm 33 at the initial position stops the rotation of the pencil-type buff processing member 32, and moves upward. Then, the pencil-type buff processing member 32 of the front end of the arm is extracted from the cleaning cup 35, the swing arm 33 is moved to the center of the substrate S, and the bottom surface of the pencil-type buff processing member 32 is pressed against the front surface of the substrate S by the downward movement of the swing arm 33. At this time, the pencil-type buff processing member 32 starts to rotate at a predetermined rotation speed immediately before the pencil-type buff processing member 32 contacts the substrate S.

The buff processing pad 322 of the pencil-type buff processing member 32 independently rotating about the rotation shaft 36 is pressed against the substrate S by the swing arm 33 while contacting the front surface of the substrate S supported and rotated by the spin chuck 31, and the pencil-type buff processing member 32 is swung from the center of the substrate S to the outer circumference portion at a predetermined speed so as to scrub-clean the front surface of the substrate S. The movement of the swing arm 33 swung to the outer circumference of the substrate S is stopped and the swing arm is moved upward. Then, the pencil-type buff processing member 32 is separated from the front surface of the substrate S. This operation is set as a one-cycle operation. The cleaning treatment can be repeatedly performed by moving the swing arm 33 at the upward movement position in the outer circumference portion of the substrate S to the position of the center of the substrate S again.

After the above-described operation is performed once or more, the injection of the cleaning liquid from the cleaning liquid supply nozzle 34 is stopped, and the swing arm 33 is moved so that the pencil-type buff processing member 32 is moved to the upper position of the cleaning cup 35. Then, the pencil-type buff processing member 32 is moved downward and is rotated inside the cleaning cup 35 so as to be self-cleaned. In this way, the cleaning treatment ends.

Immediately after the cleaning treatment ends, the spin chuck 31 is rotated at a high speed under the presence of a dry inert gas so that the cleaned substrate S is dried in a spinning state. When the cleaning treatment is performed by moving the swing arm 33 from the center of the substrate S to the outer circumference portion, the substrate S is rotated by the spin chuck 31 so that a centrifugal force caused by a rotation is applied to contaminated materials or particles existing on the front surface of the substrate S. Accordingly, contaminated materials or particles are scraped off in the same direction as the direction in which the centrifugal force is exerted.

Figure 22:
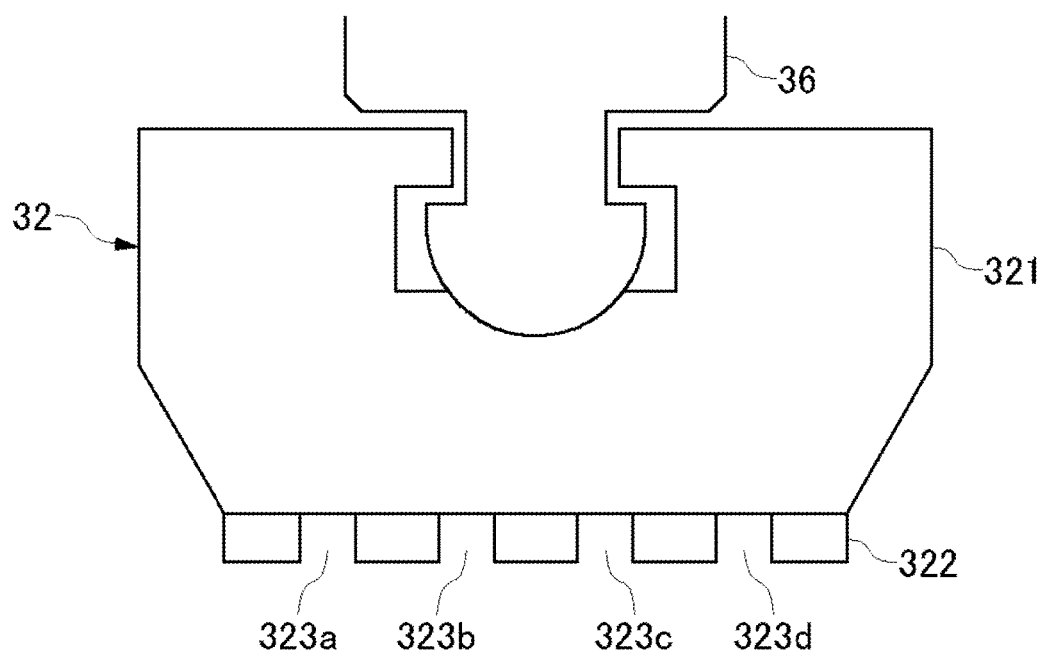
FIG. 22 is a longitudinal sectional view of a pencil type buff processing member of the third embodiment of the technology.

FIG. 22 is a longitudinal sectional view of the pencil-type buff processing member 32 of the buff processing apparatus 30. The pencil-type buff processing member 32 is attached to the lower end of the rotation shaft 36, and the pencil-type buff processing member 32 includes a base portion 321 and a buff processing pad 322 stuck to the lower surface of the base portion 321. The buff processing pad 322 is cut into a predetermined size by the use of polishing cloth and is attached to the lower surface of the base portion 321. The polishing cloth is attached by the use of the adhesive seal of the rear surface thereof. The base portion 321 contacts the rotation shaft 36 at the spherical surface, and hence the polishing cloth uniformly contacts the substrate S even when the substrate is inclined.

Generally, the buff processing pad 322 is polishing cloth used to polish a substrate as a mirror surface and a flat surface, and is obtained in a market. For example, a pad (specifically, for example, variations of IC1000 (trademark)/SUBA (trademark) obtained in a market) obtained by laminating rigid polyurethane foam or woven cloth or a suede type pad (specifically, for example, Supreme (trademark) obtained in a market) can be used. The polyurethane foam is porous, and many fine recesses or holes are formed on the surface thereof.

In the embodiment, a plurality of (in the embodiment, four) slits 323a to 323d is formed on the bottom surface of the pencil-type buff processing member 32 similarly to the second embodiment. The slits 323a to 323d are formed from one edge to the other edge of the pencil-type buff processing member 32 while not being divided. The slits 323a to 323d are formed in a linear shape having a constant width. As illustrated in FIG. 22, the depth of the slit may be equal to or deeper than the depth of the buff processing pad 322.

Since the slits 323a to 323d are formed in the pencil-type buff processing member 32 in one direction, the supply and the discharge of the processing liquid (slurry or cleaning processing liquid) below the buff processing pad 322 is promoted. When the processing liquid stays below the buff processing pad 322, a scratch is generated in the buff processing treatment, and hence the substrate is contaminated in the buff cleaning treatment. However, since the supply and the discharge of the liquid are promoted, it is possible to prevent a scratch from being generated in the buff polishing treatment and hence to improve a cleaning effect in the buff cleaning treatment.

In addition to the processing liquid supplied from the cleaning liquid supply nozzle 34, the processing liquid may be also supplied from the center of the buff processing pad 322 through a liquid supply line communicating with opening portions formed in the swing arm 33, the rotation shaft 36, and the base portion 321 and the buff processing pad 322 of the pencil-type buff processing member 32.

According to the technology, since the target cleaning surface is scrubbed by the upstream edges of each nodule plural times, there is an effect that the cleaning effect of each nodule is improved. Alternatively, since the bottom surface of the pencil-type processing member scrubbing the surface of the substrate is provided with the slit continuously formed while not being divided from one edge to the other edge, there is an effect that the scrubbing treatment ability on the surface of the substrate is improved. Further, since the liquid supplied to the surface of the substrate easily enters the slit and the liquid is easily discharged from the slit, there is an effect that a fresh liquid is supplied to the slit. Accordingly, the technology is useful for the roll-type processing member or the pencil-type processing member for processing the surface of the substrate by scrubbing the surface of the substrate.

While preferred embodiments of the technology have been described, the embodiments can be modified into various forms, and all modified forms within the scope and the spirit of the technology are included in claims.

What is claimed is:

1. A roll-type processing member for processing a surface of a substrate by scrubbing the surface of the substrate, comprising:
    a nodule which is formed on a surface of the roll-type processing member,
    wherein the nodule includes a plurality of upstream edges which are provided in the rotation direction of the roll-type processing member, the plurality of upstream edges being edges located at the upstream sides of a front end surface of the nodule when the front end surface contacts the surface of the substrate by the rotation of the roll-type processing member, and
    wherein the nodule includes a slit or a concave portion that is formed on the front end surface of the nodule, wherein a height of a depth of the slit or the concave portion is less than a height of the nodule on either side of the slit or the concave portion.

2. The roll-type processing member according to claim 1, wherein adjacent nodules in the rotation direction of the roll-type processing member include an overlap portion in which the adjacent nodules overlap each other in the rotation axis direction of the roll-type processing member, and the at least one of the plurality of upstream edges formed by the slit or the concave portion has a length in which a non-overlap portion except for the overlap portion in the front end surface is covered in the rotation axis direction of the roll-type processing member.

3. The roll-type processing member according to claim 1, wherein the slit or the concave portion has a shape which is narrowed in the depth direction.

4. A roll-type processing member for processing a surface of a substrate by scrubbing the surface of the substrate, comprising:
    a nodule which is formed on a surface of the roll-type processing member,
    wherein the nodule includes a slit or a concave portion which extends so as not to be parallel to the rotation direction of the roll-type processing member, wherein a height of a depth of the slit or the concave portion is less than a height of the nodule on either side of the slit or the concave portion.

5. The roll-type processing member according to claim 4, wherein the slit is bent in a convex shape in the rotation direction of the roll-type processing member.

6. A substrate processing apparatus comprising:
    the roll-type processing member according to claim 1;
    a rotational driving mechanism which rotates the roll-type processing member about the rotation axis; and
    a substrate holder which holds the substrate so that the surface of the substrate is parallel to the rotation axis direction of the roll-type processing member at a position contacting the nodule of the roll-type processing member.

7. A roll member for processing a surface of a substrate by contacting the surface of the substrate, comprising:
    a nodule on a surface of the roll member,
    wherein the nodule comprises at least a first edge portion and a second edge portion,
    a groove portion is formed adjacent to the first edge portion and the second edge portion,
    the groove portion has a width and a depth which do not completely close by deformation of the nodule contacting the substrate, wherein a height of the depth of the groove portion is less than a height of the nodule on either side of the groove portion,
    the nodule is divided by the groove portion so as to form the first edge portion and the second edge portion.

8. The roll member according to claim 7, wherein each of the first edge portion and the second edge portion is configured to be able to face-contact the substrate at a substantially identical height with respect to each other to the groove portion when contacting the substrate.

9. The roll member according to claim 7, wherein the first edge portion is an upstream edge positioned at an upstream side when a front end surface of the nodule contacts the surface of the substrate by a rotation of the roll member, and the roll member comprises a plurality of the upstream edges arranged in a rotation direction of the roll member.

10. The roll member according to claim 7, wherein the upstream edges are formed by the groove portion being formed on the front end surface of the nodule.

11. The roll member according to claim 10,
    wherein the adjacent nodules in the rotation direction of the roll member include an overlap portion in which the adjacent nodules overlap each other in the rotation axis direction of the roll member, and the upstream edges formed by the slit or the concave portion has a length in which a non-overlap portion except for the overlap portion in the front end surface is covered in the rotation axis direction of the roll member.

12. The roll member according to claim 7, wherein the groove portion has a shape which is narrowed in the depth direction.

13. A roll member for processing a surface of a substrate by scrubbing the surface of the substrate, comprising:
    a nodule on a surface of the roll member,
    wherein the nodule comprises a slit or a concave portion extending non-parallel to a rotation direction of the roll member to divide the nodule to form a first edge portion and a second edge portion, wherein a height of a depth of the slit or the concave portion is less than a height of the nodule on either side of the slit or the concave portion,
    each of the first edge portion and the second edge portion is configured to be able to face-contact the substrate at a substantially identical height with respect to each other to the slit or the concave portion when contacting the substrate.

14. A roll member for processing a surface of a substrate by scrubbing the surface of the substrate, comprising:
    a nodule on a surface of the roll member,
    wherein the nodule comprises a slit or a concave portion extending non-parallel to a rotation direction of the roll member to divide the nodule to form a first edge portion and a second edge portion, wherein a height of a depth of the slit or the concave portion is less than a height of the nodule on either side of the slit or the concave portion, and
    the slit or the concave portion is bent in a convex shape in the rotation direction of the roll member.

15. The roll member according to claim 7 further comprising:
    a roll-shaped axis core;
    the nodule on the surface of the roll member; and a roll-shaped sponge member fixed at an outer circumference of the axis core.

16. The roll member according to claim 13 further comprising:
a roll-shaped axis core;
the nodule on the surface of the roll member; and
a roll-shaped sponge member fixed at an outer circumference of the axis core.

17. The roll member according to claim 14 further comprising:
a roll-shaped axis core;
the nodule on the surface of the roll member; and
a roll-shaped sponge member fixed at an outer circumference of the axis core.

18. A substrate processing apparatus comprising:
the roll member according to claim 7;
a rotational driving means which rotates the roll member about the rotation axis; and
a substrate holder which holds the substrate so that the surface of the substrate is parallel to the rotation axis direction of the roll member at a position contacting the nodule of the roll member.

19. A substrate processing apparatus comprising:
the roll member according to claim 13;
a rotational driving means which rotates the roll member about the rotation axis; and
a substrate holder which holds the substrate so that the surface of the substrate is parallel to the rotation axis direction of the roll member at a position contacting the nodule of the roll member.

20. A substrate processing apparatus comprising:
the roll member according to claim 14;
a rotational driving means which rotates the roll member about the rotation axis; and
a substrate holder which holds the substrate so that the surface of the substrate is parallel to the rotation axis direction of the roll member at a position contacting the nodule of the roll member.

21. A substrate cleaning method using the substrate processing apparatus according to claim 8, comprising:
holding and rotating the substrate by a substrate holder;
supplying cleaning liquid on the surface of the substrate from a cleaning liquid supplying nozzle to the rotating substrate;
rotating the roll member about the rotation axis;
under existence of the cleaning liquid, cleaning the surface of the substrate by contacting the roll member with the surface of the substrate being parallel to a direction of the rotation axis of the roll member at a position where the nodule of the substrate contacts the surface of the substrate.

* * * * *